(12) United States Patent
Ohta et al.

(10) Patent No.: US 6,228,688 B1
(45) Date of Patent: May 8, 2001

(54) FLIP-CHIP RESIN-ENCAPSULATED SEMICONDUCTOR DEVICE

(75) Inventors: Hideo Ohta, Tokyo; Tetsuo Okuyama, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/017,228

(22) Filed: Feb. 2, 1998

(30) Foreign Application Priority Data

Feb. 3, 1997 (JP) .................................................. 9-020469

(51) Int. Cl.⁷ .................................................. H01L 21/48
(52) U.S. Cl. ..................... 438/127; 438/108; 438/124; 438/126
(58) Field of Search ..................... 438/108, 109, 438/118, 124, 126, 127, 106, 26, 51, 64; 257/787, 788, 789, 795

(56) References Cited

U.S. PATENT DOCUMENTS

| | | | | |
|---|---|---|---|---|
| 4,143,456 | * | 3/1979 | Inoue ..................................... | 29/588 |
| 4,680,617 | | 7/1987 | Ross ..................................... | 257/795 |
| 5,043,211 | * | 8/1991 | Yoshizumi et al. .................. | 428/331 |
| 5,120,678 | * | 6/1992 | Moore et al. ........................ | 438/125 |
| 5,218,234 | * | 6/1993 | Thompson et al. ................. | 257/787 |
| 5,258,426 | * | 11/1993 | Uchida et al. ....................... | 523/435 |
| 5,385,869 | * | 1/1995 | Liu et al. . | |
| 5,641,997 | * | 6/1997 | Ohta et al. .......................... | 257/788 |
| 5,891,754 | * | 4/1999 | Bowles et al. ...................... | 438/108 |
| 5,918,113 | * | 6/1999 | Higashi et al. ..................... | 438/119 |
| 5,981,312 | * | 11/1999 | Farquhar et al. ................... | 438/112 |
| 5,981,313 | * | 11/1999 | Tanaka ................................ | 438/118 |
| 5,998,243 | * | 12/1999 | Odashima et al. .................. | 438/127 |
| 6,015,722 | * | 1/2000 | Banks et al. ........................ | 438/108 |

FOREIGN PATENT DOCUMENTS 6-112369    4/1994  (JP) .

* cited by examiner

Primary Examiner—Olik Chaudhuri
Assistant Examiner—Alonzo Chambliss
(74) Attorney, Agent, or Firm—Oblon, Spivak, McClelland, Maier & Neustadt, P.C.

(57) ABSTRACT

A method of manufacturing a resin-encapsulated semiconductor device, which includes the steps of, mounting a semiconductor element facedown on a substrate provided with a wiring circuit with a main surface of the semiconductor element being faced to the substrate, positioning the substrate bearing the semiconductor element in a mold together with a sealing resin, and applying a pressure onto the sealing resin to move the sealing resin to a space between the semiconductor element and the substrate, to the sides of the semiconductor element and to the bottom surface of the semiconductor element, thereby sealing the semiconductor element with the sealing resin.

15 Claims, 6 Drawing Sheets

FLIP-CHIP RESIN-ENCAPSULATED SEMICONDUCTOR DEVICE

BACKGROUND OF THE INVENTION

This invention relates to a method of manufacturing a resin-encapsulated semiconductor device and to a resin-encapsulated semiconductor device. In particular, this invention relates to a resin-encapsulated semiconductor device wherein semiconductor elements are mounted facedown on a substrate.

In recent years, the package of resin-encapsulated semiconductor device is increasingly enlarged in scale and the number of the pins (the outer leads) of the package is also increasing. These trends are believed to be further accelerated in future. On the other hand, in order to realize a high density packaging of semiconductor devices so as to miniaturize electronic devices, the semiconductor package itself is requested to be as small and thin as possible.

However, when the number of the pins of the package is increased, the package is inevitably enlarged even if the semiconductor element itself is the same in size, thereby making it difficult to realize a high density packaging of semiconductor devices. Accordingly, a BGA (Ball Grid Array) package which makes it possible to increase the number of the pins without substantially enlarging the size of the package is now increasingly employed. This BGA is constructed such that a bare chip is mounted on an upper surface of a double-sided printed wiring board (substrate) and a two-dimensional array of solder balls is applied to the bottom surface of thereof. The pitch of the terminals in the BGA is made wider than that of QFP (Quad Flat Package) having the same number of pins as that of BGA. As a result, the BGA is advantageous in improving the reliability of a package having a large number of pins.

Additionally, CSP (Chip Size Package) which mounts a bare chip on a double-sided printed wiring substrate like the aforementioned BGA and enables to obtain a micropackage having almost the same size as that of the chip is of great demand particularly in a field where the number of pins is smaller than the BGA. Furthermore, COG (Chip On Glass) wherein a bare chip is mounted on a glass substrate as well as COB (Chip On Board) wherein a bare chip is mounted on a wiring substrate are also widely used since these packaging methods enable the package area to be minimized.

The packages mentioned above are manufactured by mounting a bare chip facedown on a double-sided printed wiring substrate thereby electrically connecting the chip with the circuit via bumps, and then by filling the space between the bare chip and the wiring substrate with a liquid resin. However, since the interval between the bare chip and the wiring substrate is generally very small, i.e. as narrow as several tens micrometers, if the filler contained in the liquid resin is too small in particle diameter, the viscosity of the resin would be increased, thereby making it difficult to fill the space. It is now considered that even when a chip having a dimension of 10 mm×10 mm is to be sealed, the liquid resin to be employed for the filling cannot contain more than about 60% of a filler, and that when a chip having a larger dimension than the aforementioned one is to be sealed, the filling by making use of a resin would become more difficult. On the other hand, since a sealing (encapsulating) resin containing a low content of a filler would absorb a lot of water, the encapsulation of semiconductor device with such a sealing resin would invite generation of cracks at the moment of reflow. Further, since the filling of a liquid resin in a space between a semiconductor element and a wiring substrate is effected through a capillary phenomenon based on the surface tension of these materials, the propagation of a sealing resin entering from one of four sides of the chip (semiconductor element) to all of the space may take a long period of time. Moreover, since a sealing resin to be employed in this manner is usually incorporated with an acid anhydride as a curing agent so as to keep it liquid at the normal temperature, it may give rise to the problem of poor reliability of the resultant package.

As for the semiconductor device wherein the space between a semiconductor element and a wiring substrate is filled with a resin of aforementioned composition by means of a so-called potting method, the sides and bottom surface of the semiconductor element are left exposed in contrast to the semiconductor device which is entirely covered with a resin by means of a transfer molding method. Therefore, water may be easily penetrated into an interface between the sealing resin and the wiring substrate or between the sealing resin and the semiconductor element, thus giving rise to various problems including the warpage of the resultant package.

However, the employment of transfer molding method for encapsulating all of a semiconductor element including the sides and bottom surface thereof with a resin is also accompanied with various problems. For example, encapsulation of a flip chip with a resin by making use of a conventional transfer molding method is performed as illustrated in FIG. 1. Referring to FIG. 1, a semiconductor element 35 is mounted via a bump 39 on a wiring substrate 38 having bumps 40, which is then interposed between an upper mold 34 and a lower mold 33, after which a space around the semiconductor element 35 is impregnated with a sealing resin 37. In this case, the resin 37 which has been pressurized in a pot is forced to flow, under a high pressure, through a runner into a cavity, thereby filling spaces between the semiconductor element 35 and the wiring substrate 38, and between the upper mold 34 and the semiconductor element 35. It is generally considered that in order to sufficiently impregnate this narrow space with a resin, a higher pressure than that employed in the ordinary transfer molding method is required. However, there is still a problem that even if a sealing resin is ejected into a cavity under a high pressure, it is difficult to sufficiently transmit the pressure throughout the space since the flow of resin may be restricted at the runner or cavity gate 41, thereby incompletely filling the space with the resin. Furthermore, since a sealing resin is forced to flow from one side gate of cavity, the resin is required to run from one side of the cavity to the opposite side of the cavity, i.e. to run a long distance. As a result, the time required for the molding is prolonged, and under some circumstances, the resin flow is forced to stop halfway. In the case of transfer molding, since a resin is caused to flow from a pot to a cavity via a runner, the mold thereof is rather complicated in structure and large in size, thus making it very difficult to perform the encapsulation of a semiconductor element which is directly mounted on a packaging substrate as in the case of aforementioned COG and COB. Therefore, a mold which is small and simple in structure is required for the manufacture of a micropackage.

Even if the encapsulation of semiconductor device is performed by means of a transfer molding method which enables a semiconductor element to be completely covered by a resin, there is a possibility of producing a product where the sealing resin layer is missing on the bottom surface of the semiconductor element or where the resin covering the semiconductor element is too thin. In such cases, the encapsulated semiconductor element is expected to be easily damaged when a shock is externally applied to the package. It may be possible to avoid such damages by forming a thick resin layer on the bottom surface of the semiconductor element. However, if the resin layer applied to the bottom surface of the semiconductor element is too thick, it will invite various bad influences on the package. For example, due to the cure shrinkage of thick resin layer or due to a difference in thermal expansion coefficient between the thick resin layer and the semiconductor element, the package may be warped. Therefore, the thickness of the sealing resin is required to be delicately controlled for the purposes of enhancing the mechanical strength and preventing the warpage of the package. However, the delicate control in thickness of the sealing resin is difficult due to a problem of poor filling property of the conventional resin composition when it is employed for filling a narrow space. Further, it is difficult to fill a narrow space between a semiconductor element and a packaging substrate with a resin by making use of the conventional transfer molding method.

BRIEF SUMMARY OF THE INVENTION

Accordingly, an object of the present invention is to provide a method of manufacturing a resin-encapsulated semiconductor device, which makes it possible to easily form a void-free resin layer all over (without leaving an unfilled portion) a semiconductor element which has been mounted facedown on a substrate.

Another object of the present invention is to provide a resin-encapsulated semiconductor device which is capable of withstanding an external shock and of avoiding a warpage thereof, and is excellent in reliability.

Namely, according to the present invention, there is provided a method of manufacturing a resin-encapsulated semiconductor device, which comprises the steps of:

mounting a semiconductor element facedown on a substrate provided with a wiring circuit with a main surface of the semiconductor element being faced to the substrate;

positioning the substrate bearing the semiconductor element in a mold together with a sealing resin; and applying a pressure onto the sealing resin to cause the sealing resin to flow into a space between the semiconductor element and the substrate, to the sides of the semiconductor element and to the bottom surface of the semiconductor element, thereby sealing the semiconductor element with the sealing resin.

Furthermore, according to the present invention, there is provided a method of manufacturing a resin-encapsulated semiconductor device, which comprises the steps of:

mounting a semiconductor element facedown on a substrate provided with a wiring circuit with a main surface of the semiconductor element being faced to the substrate;

positioning a frame-like mold around the semiconductor element mounted on the substrate or below the substrate;

positioning a press mold which is designed to fit in the frame-like mold and adapted to move up and down within the frame-like mold; and applying a pressure, by means of the press mold, onto a sealing resin which has been placed in advance in a region defined by the frame-like mold and the press mold, thereby forcing the sealing resin to flow into a space between the semiconductor element and the substrate, to the sides of the semiconductor element and to the bottom surface of the semiconductor element, thereby sealing the semiconductor element with the sealing resin.

According to this invention, there is further provided a resin-encapsulated semiconductor device comprising:

a substrate provided with a wiring circuit;

a semiconductor element mounted facedown on a substrate with a main surface of the semiconductor element being faced to the substrate; and a sealing resin layer disposed in a space between the semiconductor element and the substrate, on the sides of the semiconductor element and on the bottom surface of the semiconductor element;

wherein a dimension of the semiconductor element and a thickness of the sealing resin layer are controlled to meet a relationship represented by the following equation (2);

$$30 < a t_c t_u / t_m < 800 \quad (2)$$

wherein "a" is a plane area (mm$^2$) of the semiconductor element; $t_c$ is a thickness (mm) of the semiconductor element; $t_u$ is a thickness (mm) of the resin layer disposed on the bottom surface of the semiconductor element; and $t_m$ is a thickness (mm) of the resin layer disposed in a space between the semiconductor element and the substrate;

and the sealing resin layer comprises epoxy resin, phenol resin, a catalyst and a filler containing a spherical filler; the content of the filler being not less than 50% by weight based on an entire resin composition, the content of the spherical filler being not less than 50% by weight based on an entire filler, and a maximum particle diameter of the filler (R) meeting a relationship represented by the following equation (1);

$$R < 0.95 L \quad (1)$$

wherein L is an interval between of the substrate provided with a wiring circuit and the semiconductor element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

This invention will be further explained in detail with reference to the following preferred embodiments.

Figure 2A:
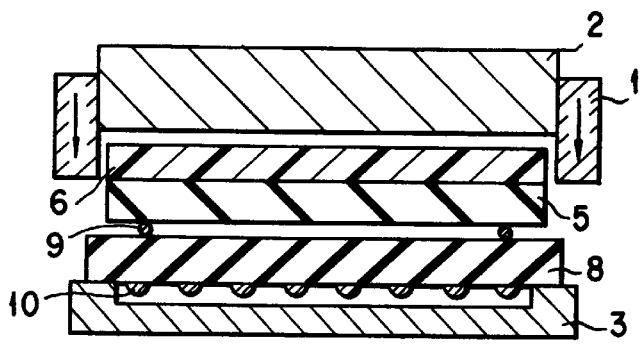
FIGS. 2A to 2D are cross-sectional views showing a manufacturing process of a resin-encapsulated semiconductor device according to this invention.

FIGS. 2A to 2D are cross-sectional views showing a manufacturing process of a resin-encapsulated semiconductor device according to this invention. Namely, as shown in FIG. 2A, a semiconductor element 5 is mounted facedown on a double-sided printed wiring substrate 8 via bumps 9, i.e. the main surface of the semiconductor element 5 being faced to the surface of the substrate 8. A sealing resin 6 is disposed on the bottom surface of the semiconductor element 5. As for the form of the sealing resin 6 to be employed in this case, it may be a solid sheet-like form, a solid bulky form, a granular form or a highly viscous form. The sealing resin 6 can be applied to the bottom surface of the semiconductor element by preliminarily forming the resin into a predetermined size or thickness and arranging it at the bottom surface of the semiconductor element in the case where the sealing resin is formed of the aforementioned solid matters, or by suitably selecting a suitable number of granules in correspondence with a predetermined volume and applying them to the bottom surface of the semiconductor element in the case where the sealing resin is formed of the aforementioned granular matter. On the other hand, if the sealing resin is of the aforementioned highly viscous form, a predetermined volume of the resin is applied to the bottom surface of the semiconductor element by means of a dispenser. It may be preferable, for the purpose of facilitating the feeding of a highly viscous liquid resin, to heat the resin thereby temporarily lowering the viscosity of the resin.

After the sealing resin 6 is applied to the bottom surface of the semiconductor element 5, the double-sided printed wiring substrate 8 is set in place on a lower mold 3. Then, a frame-like mold 1 and a press mold 2 which is adapted to move up and down within the frame-like mold 1 are set in place over the bottom surface of the semiconductor element 5 carrying the sealing resin 6. When the atmosphere surrounding all over the mold is evacuated to turn it into a vacuum at this stage, the air can be evacuated from the space between the semiconductor element 5 and the double-sided printed wiring substrate 8, thereby making it possible to effectively prevent a void and unfilled portion from generating in the sealing resin layer.

Figure 2B:
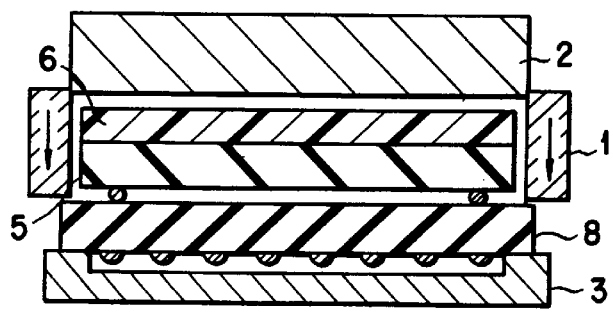
Figure 2C:
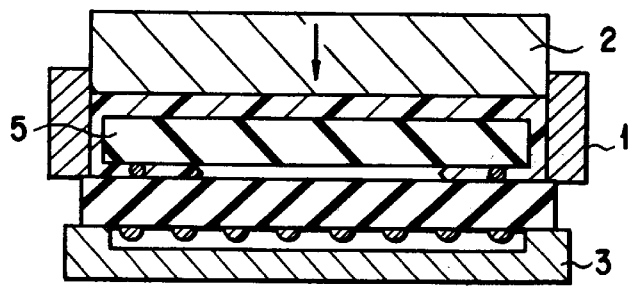

Then, as shown FIG. 2B, the frame-like mold 1 is moved downward to hold the double-sided printed wiring substrate 8. At this moment, the sealing resin 6 and the semiconductor element 5 are completely enclosed by a region defined by the printed wiring substrate 8, the frame-like mold 1 and the press mold 2. Then, as shown in FIG. 2C, the press mold 2 is moved downward to directly apply a pressure onto the sealing resin 6. Since these molds 1 and 2 are heated in advance, the sealing resin 6 is caused to melt in these molds and turned into a fluid state. The molten resin thus pressurized by the press mold 2 is forced to flow through the space between four sides of the semiconductor element 5 and the side walls of the frame-like mold into the space between the semiconductor element 5 and the printed wiring substrate 8 until it reaches the center of the space. Since the sealing resin flows into the space between the semiconductor element 5 and the printed wiring substrate 8 all at once from four sides thereof, the distance of resin flow can be shortened and hence a molding time can be also shortened. In this case, if the mold is entirely kept in a vacuum at this stage shown in FIG. 2A, there is no possibility that air is left at the central portion of the space between the semiconductor element 5 and the printed wiring substrate 8. Further, since the printed wiring substrate 8 is held by the frame-like mold 1, the molten resin can be prevented from leaking out of the molds, thus making it possible to apply a sufficiently high pressure to the sealing resin. Since a pressure is directly transmitted from the press mold 2 to the sealing resin, the molten resin is allowed to fill the space between the semiconductor element 5 and the printed wiring substrate 8 under a constant high pressure that has been applied to the resin.

Figure 2D:
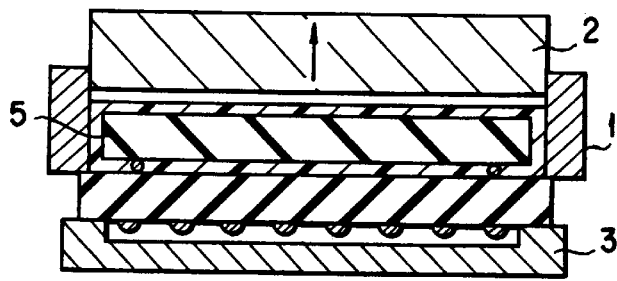
Figure 3:
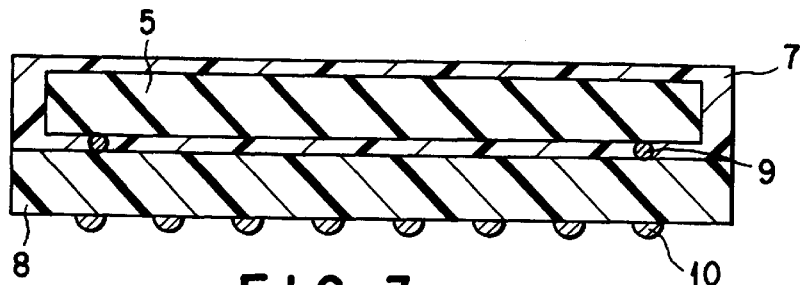
FIG. 3 is a cross-sectional view showing one example of the resin-encapsulated semiconductor device according to this invention.

When a thermosetting resin is employed as a sealing resin, the sealing resin is allowed to cure under this high temperature condition. Finally, as shown in FIG. 2D, the press mold 2 is opened, thereby allowing the molded package to be taken out of the mold. As a result, a package shown in FIG. 3 wherein the semiconductor element 5 is mounted facedown on the double-sided printed wiring substrate 8 and entirely encapsulated by the resin layer 7 can be obtained.

When a relatively thin semiconductor element is employed in this case, even if the semiconductor element is completely encapsulated with a resin layer in this manner, there is a possibility that the semiconductor element may be damaged by an external shock if the resin layer formed on the bottom surface of the semiconductor element is relatively thin. Accordingly, the thickness of the resin layer formed on the bottom surface of the semiconductor element is required to be increased to some degree. Specifically, the thickness of the resin layer formed on the bottom surface of the semiconductor element is required to be larger than that of the resin layer to be formed between the semiconductor element and the printed wiring substrate. Preferably, the thickness of the resin layer formed on the bottom surface of the semiconductor element is required to be at least 1.1 time as large as that of the resin layer to be formed between the semiconductor element and the printed wiring substrate. In particular, when the semiconductor element employed is as thin as 0.3 mm or less, the thickness of the resin layer formed on the bottom surface of the semiconductor element should preferably be at least 1.5 time as large as that of the resin layer to be formed between the semiconductor element and the printed wiring substrate.

On the other hand, in the case where a semiconductor element of relatively large size is to be employed, when the thickness of the sealing resin layer formed on the bottom surface of the semiconductor element is too large, the package may be warped due to a cure shrinkage of the thick sealing resin layer or due to a difference in thermal expansion coefficient between the thick sealing resin layer and the semiconductor element.

Accordingly, in the case where a semiconductor element having a dimension of 15 mm×15 mm or more is to be employed, the thickness of the resin layer formed on the bottom surface of the semiconductor element is required to be decreased to some degree. Specifically, the thickness of the resin layer formed on the bottom surface of the semiconductor element is required to be smaller than that of the resin layer to be formed between the semiconductor element and the printed wiring substrate. Preferably, the thickness of the resin layer to be formed between the semiconductor element and the printed wiring substrate is required to be at least 1.1 times as large as that of the resin layer to be formed on the bottom surface of the semiconductor element. In particular, when a semiconductor element having a dimension of 15 mm×15 mm or more is to be employed, the thickness of the resin layer to be formed between the semiconductor element and the printed wiring substrate should preferably be at least 1.5 times as large as that of the resin layer to be formed on the bottom surface of the semiconductor element.

Figure 4A:
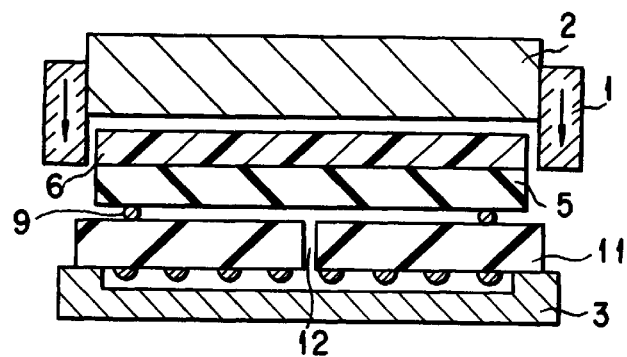
FIGS. 4A to 4D are cross-sectional views showing another example of manufacturing process of a resin-encapsulated semiconductor device according to this invention.
Figure 4B:
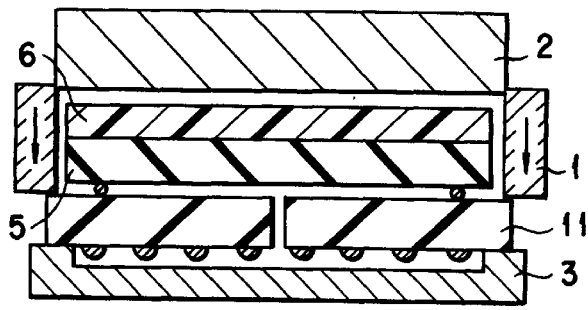
Figure 4C:
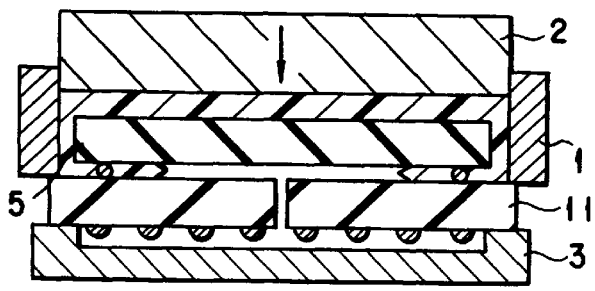

FIGS. 4A to 4D are cross-sectional views showing another example of manufacturing process of a resin-encapsulated semiconductor device according to this invention. As shown in FIG. 4A, a semiconductor element 5 is mounted facedown on a substrate 11, i.e. the main surface of the semiconductor element 5 being faced to the surface of the substrate 11. This substrate 11 is provided with one through-hole 12 near the center thereof. By the way, a plurality of through-holes may be formed in the same manner. The same procedures as shown in FIGS. 2A to 2D are repeated except that the substrate 11 provided with the through-hole 12 is employed. Namely, as shown FIG. 4B, the frame-like mold 1 is moved downward to hold the printed wiring substrate 11. Then, as shown in FIG. 4C, the press mold 2 is moved downward to directly apply a pressure onto the sealing resin 6. Since the substrate 11 provided with the through-hole 12 in this case, it is possible to purge any residual air out of the mold without necessitating the evacuation of the mold, thereby making it possible to effectively prevent a void and unfilled portion from generating in the sealing resin layer.

Figure 4D:
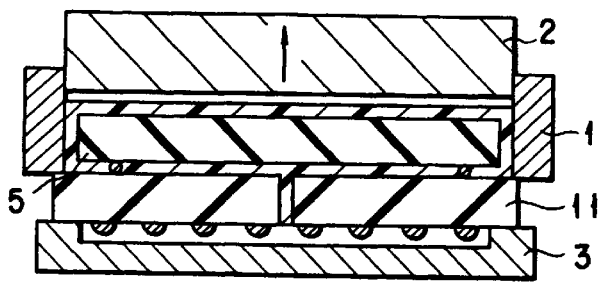

Further, since it is also possible to discharge any superfluous sealing resin from this through-hole 12 as shown in FIG. 4D, the thickness of the package to be finally obtained can be made uniform, and at the same time, the generation of burr can be inhibited. Additionally, since the sealing resin 6 is allowed to enter into this through-hole 12, the adhesion between the sealing resin and the substrate 11 can be enhanced, thus improving the reliability of the encapsulated semiconductor device.

As far as the improvement of adhesion between the sealing resin 6 and the substrate 11 is concerned, it may be preferable to increase the number of through-holes 12 as much as possible. However, in view of utilizing the through-hole as an air vent, an excessive number of through-hole will give rise to the generation of an unfilled portion missing sealing resin due to a decrease in pressure to the sealing resin. Therefore, the number of the through-holes should preferably be one or so. For the same reason as in the case of the number of through-holes, if the size of the through-hole is too large, the pressure to the sealing resin flow would be lowered. Therefore, the size of the through-hole should preferably be 1 mm or less in diameter. Particularly, when the size of the semiconductor element is 5 mm×5 mm or less, the size of the through-hole should preferably be 0.5 mm or less in diameter.

Figure 5:
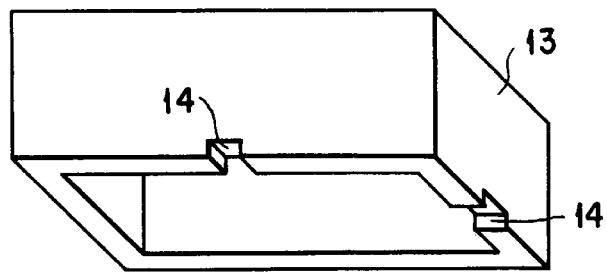
FIG. 5 is a perspective view showing one example of a frame-like mold to be employed in this invention.

The through-hole to be functioned as an air vent can be formed not only in the substrate but also in the bottom side of one to three side walls of the frame-like mold. FIG. 5 illustrates a perspective view of one example of such a frame-like mold. As shown in FIG. 5, an air vent 14 is formed at the bottom portion of each of two side walls of the frame-like mold 13. The size of this air vent should preferably be 0.1 to 2 mm in width and 10 $\mu$m to 0.5 mm in height, more preferably 0.5 to 1 mm in width and 30 $\mu$m to 0.2 mm in height.

Figure 6A:
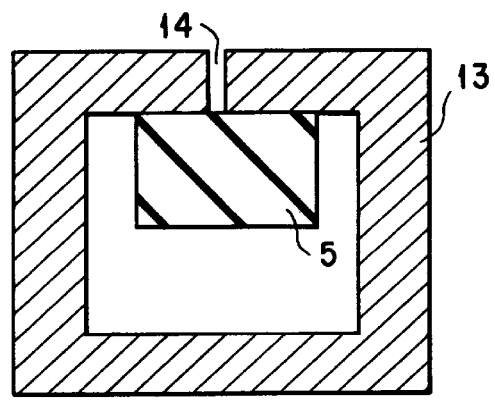
FIGS. 6A to 6C are plan views showing another example of manufacturing process of a resin-encapsulated semiconductor device according to this invention.
Figure 6B:
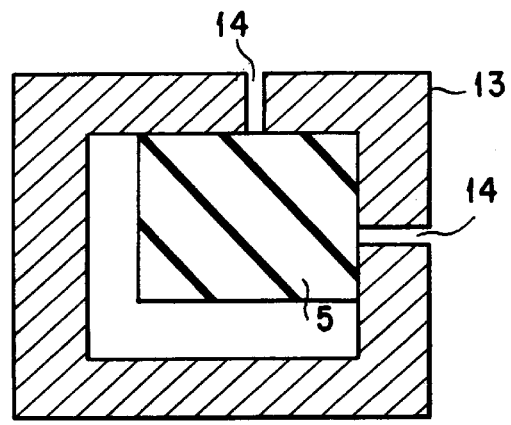
Figure 6C:
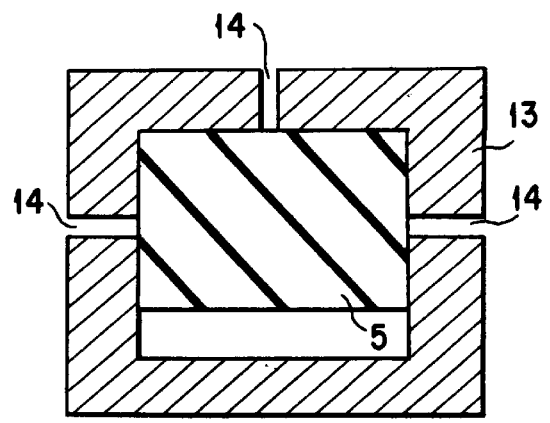

FIGS. 6A to 6C illustrate the plan views of the frame-like mold 13 provided with the air vent 14, and the layout of the semiconductor element 5 in relative to the frame-like mold 13. In FIG. 6A, the air vent is formed in one side wall of the frame-like mold. In FIG. 6B, the air vent is formed in each of neighboring two side walls of the frame-like mold. In FIG. 6C, the air vent is formed in each of three side walls of the frame-like mold. In any of the frame-like molds, the frame-like mold is arranged in relative to the semiconductor element 5 such that each side wall provided with the air vent 14 is contacted with one of the side walls of the semiconductor element 5.

Figure 7A:
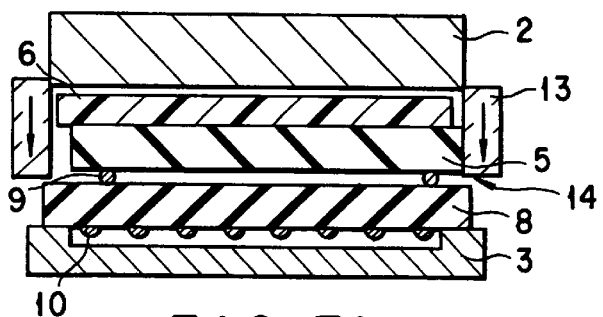
FIGS. 7A and 7B are cross-sectional views showing another example of manufacturing process of a resin-encapsulated semiconductor device according to this invention.
Figure 7B:
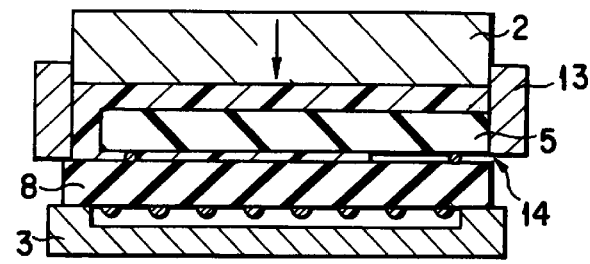

FIGS. 7A and 7B show cross-sectional views illustrating a manufacturing process of a resin-encapsulated semiconductor device by making use of the frame-like mold 13 provided with such an air vent 14.

First of all, the frame-like mold 13 is disposed around the semiconductor element 5 in such a manner that the side wall provided with the air vent 14 among all of the side walls of the frame-like mold 13 is contacted with one of the side walls of the semiconductor element 5. A sealing resin 6 is mounted on the bottom surface of the semiconductor element 5, and a press mold 2 is arranged movable up and down within the frame-like mold 13. Then, as shown in FIG. 7B, the press mold 2 is moved down thereby directly applying a pressure onto the sealing resin 6. As a result, the sealing resin 6 melted is forced to flow downward via the sides which are not contacted with the side walls of the frame-like mold 13, thus filling the space within the mold with the sealing resin while rendering the air in the mold to be pushed by the flowing resin toward the air vent 14. Therefore, it is possible, with this method, to prevent the generation of an unfilled portion missing sealing resin and to form a sealing resin layer which is free from voids without necessitating a step of evacuating the cavity of mold.

In view of assuring the mechanical strength of the resin-encapsulated semiconductor device to be obtained, the number of the side wall of the semiconductor element to be contacted with the frame-like mold should preferably be as small as possible. Namely, since the sides of the semiconductor element should desirably be sided by the sealing resin as many as possible, the employment of a frame-like mold as shown in FIG. 6A where only one side wall thereof is provided with a through-hole is preferable in particular.

In the foregoing examples, a sealing resin is arranged at first on the bottom surface of a semiconductor element mounted on a double-sided printed wiring substrate, and then a pressure is applied onto the sealing resin whereby causing the resin to fill the space within the mold thereby to manufacture a resin-encapsulated semiconductor device. However, it is also possible to arrange the sealing resin below the substrate by making use of a specific kind of substrate. The method of manufacturing a resin-encapsulated semiconductor device making use of using this specific kind of substrate will be explained in detail below.

Figure 8A:
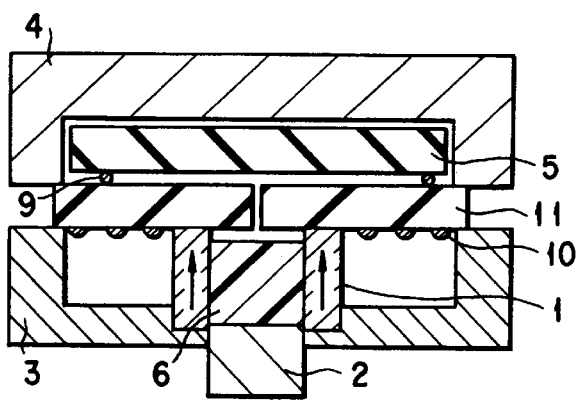
FIGS. 8A to 8C are cross-sectional views showing another example of manufacturing process of a resin-encapsulated semiconductor device according to this invention.
Figure 8B:
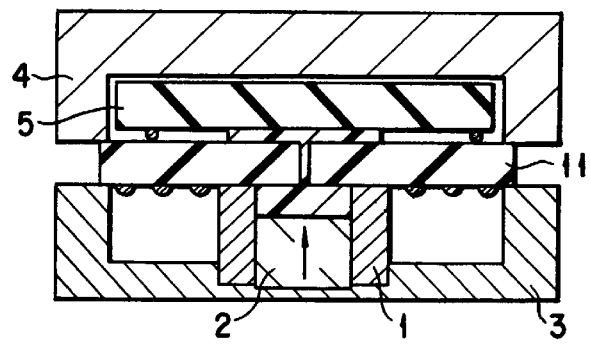
Figure 8C:
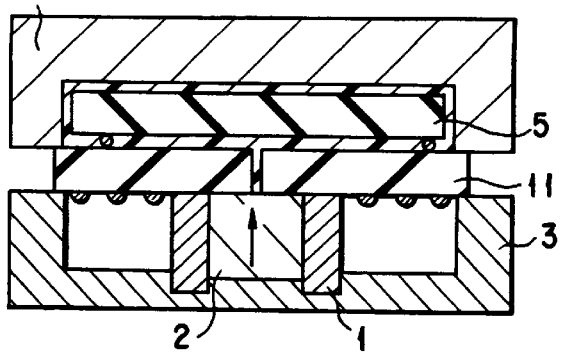

FIGS. 8A to 8C are cross-sectional views showing one example of this modified method for manufacturing a resin-encapsulated semiconductor device according to this invention.

As shown in FIG. 8A, a semiconductor element 5 is mounted facedown on a substrate 11, i.e. the main surface of the semiconductor element 5 being faced to the surface of the substrate 11. This substrate 11 is provided with one through-hole 12 near the center thereof. A frame-like mold 1 and a sealing resin 6 are disposed beneath the substrate 11 provided with the through-hole 12 as mentioned above, and a press mold 2 is arranged movable up and down within the frame-like mold 1. The upper surface of the substrate 11 where the semiconductor element 5 is mounted on is covered by an upper mold 4, thus rendering the semiconductor element 5 to be hermetically enclosed in a region defined by the substrate 11 and the upper mold 4.

Then, as shown in FIG. 8B, the press mold 2 is pushed upward, thereby directly applying a pressure onto the sealing resin 6. As a result, the sealing resin 6 is fluidized and forced to flow through the through-hole 12 of the substrate 11 into a region defined by the substrate 11 and the upper mold 4, thus filling the region with the sealing resin. Specifically, as shown in FIG. 8C, the sealing resin flows into a space between the semiconductor element 5 and the substrate 11, and into the spaces beside the side walls and a space between the upper mold and the bottom surface of the semiconductor element, thus encapsulating or sealing the semiconductor element. Since the substrate 11 provided with the through-hole 12 in this case, it is possible to purge any residual air out of the mold without necessitating the evacuation of the mold, thereby making it possible to easily fill the cavity of mold with the sealing resin while effectively preventing any void and unfilled portion from generating in the sealing resin layer.

Figure 9A:
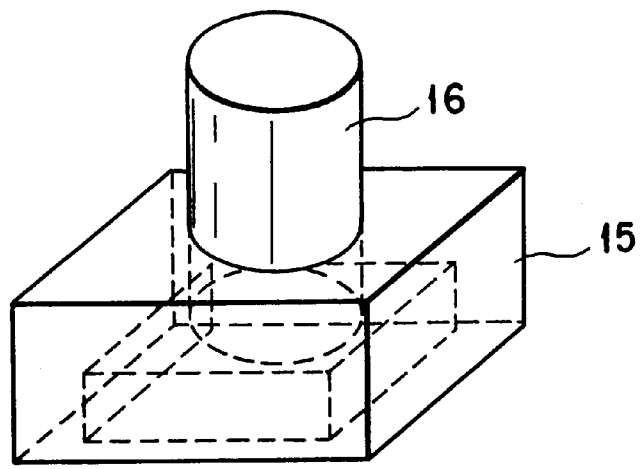
FIGS. 9A and 9B are perspective views showing another example of manufacturing process of a resin-encapsulated semiconductor device according to this invention.
Figure 9B:
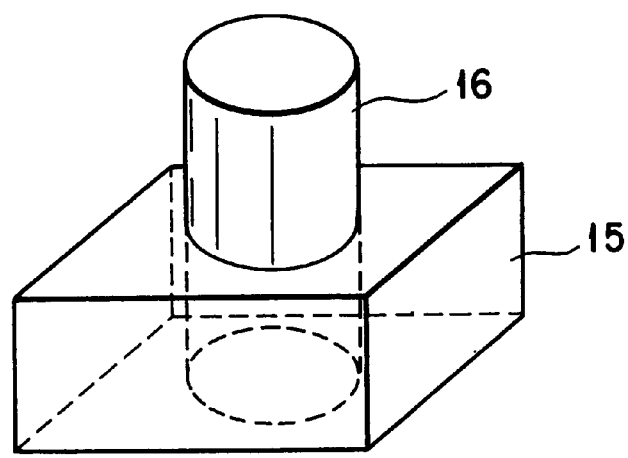
Figure 10:
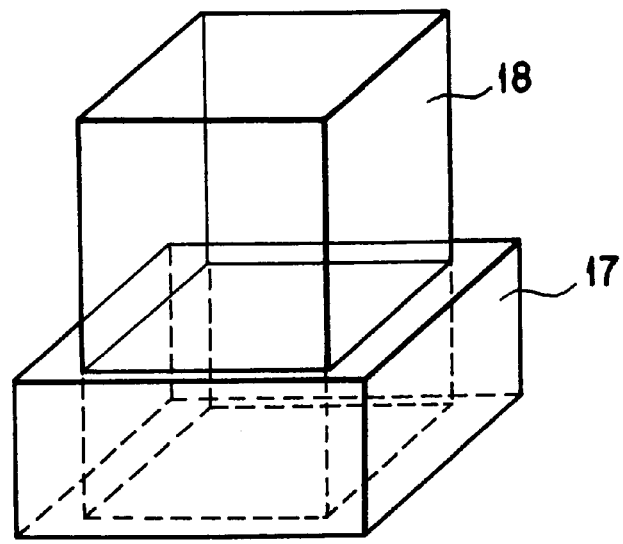
FIG. 10 is a perspective view showing another example of manufacturing process of a resin-encapsulated semiconductor device according to this invention.

It is possible to carry out the manufacturing method of this invention by making use of a frame-like mold 15 having a cylindrical inner wall and a cylindrical press mold 16 as shown in FIGS. 9A and 9B. In this case, various advantages may be obtained because of the shape of the movable portions of the mold which is free from any cornered portion. For example, when the movable portions of both frame-like mold 17 and press mold 18 are square in cross-section as shown in FIG. 10, a high precision working of the space between these molds 17 and 18 would be very difficult.

Figure 11A:
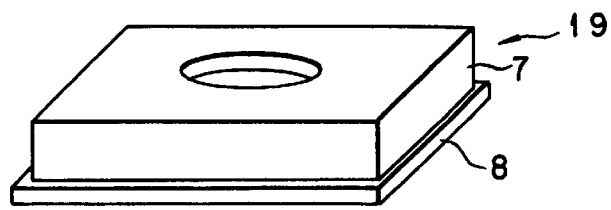
FIGS. 11A and 11B are perspective views showing another example of resin-encapsulated semiconductor device according to this invention.
Figure 11B:
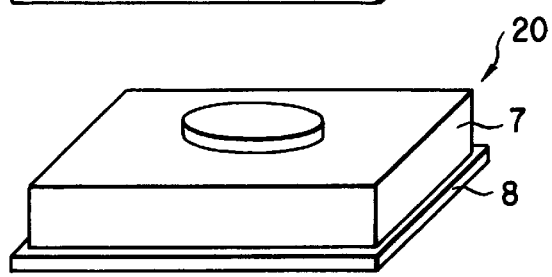

When a mold shown in FIGS. 9A and 9B is employed, packages 19 and 20 having shapes as shown in FIGS. 11A and 11B for instance can be obtained. Namely, a circular concave or convex portion would be formed on the top surface of the package as shown in FIGS. 11A and 11B, rendering the outer appearance thereof somewhat unsightly. However, the working precision of the space between the molds can be improved, and hence the nonconformity between the molds can be prevented. Therefore, in view of preventing the generation of burr resulting from the gap between the molds in a continuous production of the package, the employment of a frame-like mold 15 having a cylindrical inner wall and a cylindrical press mold 16 as shown in FIGS. 9A and 9B is preferable.

In any of the aforementioned molding methods, a post-cure of the resins after the molding of package should preferably be performed for the purpose of improving the properties of the resins.

Next, the sealing resins that can be employed in the method of this invention will be explained in detail. Namely, the sealing resin may be formed of a resin composition comprising a thermosetting resin. Examples of the thermosetting resin useful in this case include epoxy resin, polyimide resin, maleimide resin, silicone resin, phenol resin, polyurethane resin and acryl resin. These resins may be employed singly or in combination. These resins may contain various additives such as a curing agent, a cure accelerator, a releasing agent, a flame retardant, a colorant, a filler and a low stress additive.

As for the epoxy compound which is useful in this invention, any kinds of epoxy compounds can be employed as long as it contains in its molecule two or more epoxy groups. Examples of such compound are biphenyl type epoxy resin, phenol novolak type epoxy resin, cresol novolak type epoxy resin, naphthol novolak type epoxy resin, bisphenol A type epoxy resin, glycidyl ester type epoxy resin, glycidyl amine type epoxy resin, alicyclic epoxy resin, tris(hydroxyphenyl) alkane-based epoxy resin derived from the epoxidation of a condensate of phenol or alkylphenol with hydroxybenzaldehyde, tetra (hydroxyphenyl) alkane-based epoxy resin, 2,2',4,4'-tetrahydroxybenzophenone, triglycidyl ether of p-aminophenol, polyallylglycidyl ether, 1,3,5-trisglycidyl etherified benzene, and 2,2', 4,4'-tetraglycidoxy benzene.

These epoxy compounds may be employed singly or in combination of two or more kinds.

The mixing ratio of these epoxy resins may be generally 5 to 25% based on the resin composition.

As for the cure accelerator useful in this invention, any compound may be employed as long as it is capable of promoting the reaction between an epoxy resin and a curing agent. For example, amines, imidazoles, diazabicycloalkenes, organic phosphines, zirconium alcoholates, zirconium chelates, etc. may be employed.

Specific examples of amines are N,N-dimethylcyclohexylamine, N-methyldicyclohexylamine, triethylene diamine, diaminodiphenyl sulfone, dimethylaminomethylphenol, benzyl dimethylamine, trisdimethylaminomethylphenol, etc.

Specific examples of imidazoles are 2-methylimidazole, 2-phenylimidazole, heptadecylimidazole, 2-heptadecylimidazole, 2-ethylimidazole, 2-ethyl-4-methylimidazole, etc.

Specific examples of diazabicycloalkenes are 1,8-diazabicyclo(5,4,0) undecene-7 (DBU), a phenol salt of DBU (such as U-CAT SA No. 1), etc.

Specific examples of organic phosphines are triphenyl phosphine (TPP), tributyl phosphine, tricyclohexyl phosphine, methyldiphenyl phosphine, etc. Among these cure accelerators, triphenyl phosphine and heptadecylimidazole are most preferable in view of their electric properties.

The mixing ratio of the aforementioned cure accelerators may be generally in the range of 70 to 130% based on the amount of an epoxy resin.

As for the thermoplastic resin useful in this invention, it may be selected from an engineering plastic (Enpla) and an super engineering plastic (Super Enpla). Specific examples thereof include ABS (acrylonitrile-butadiene-styrene), DAP (diallylphthalate), DATP (diallylterephthalate), EPE (tetrafluoroethylene hexafluoropropylene perfluorovinyl ether), ETFE (ethylene tetrafluoroethylene copolymer), EVOH (ethylene vinylalcohol copolymer), FEP (tetrafluoroethylene hexafluoropropylene copolymer), GPPS (general-purpose polystyrene), HDPE (high-density polystyrene), HIPS (high-impact polystyrene), LCP (liquid crystal polymer), LDPS (low density polystyrene), PA (polyamide), PAEK (polyallyl ether ketone), PAN (polyacrylonitrile), PAR (polyacrylate), PAS (polyallylene sulfide), PASF (polyallyl sulfone), PBT (polybutylene terephthalate), PC (polycarbonate), PCT (poly-1,4-cyclohexane dimethylene terephthalate), PE (polyethylene), PEEK (polyether ether ketone), PEI (polyether imide), PEK (polyether ketone), PEN (polyethylene naphthalate), PES (polyether sulfone), PET (polyethylene terephthalate), PFA (perfluoroalkoxyfluoro polymer), PKS (polyketone sulfide), PMMA (polymethyl methacrylate), PMP (polymethyl pentene), POM (polyacetal), PP (polypropylene), PPE (polyphenylene ether), PPO (polyphenylene oxide), PPS (polyphenylene sulfide), PS (polystyrene), PSF (polysulfone), PTFE (polytetrafluoroethylene), PUR (polyurethane), PVA (polyvinyl alcohol), PVC (polyvinyl chloride), PVDF (polyvinylidene fluoride) and PO (phenoxy) resin.

Among these resins, Enplas (such as PA, POM, PBT, PC, PPE, etc.) having a heat distortion temperature of 100 to 200° C. and being excellent in heat resistance are preferable in view of ensuring a heat resistance reliability of package after the resin-encapsulation thereof. Super Enplas (such as PPS, LCP, PES, etc.) having a heat distortion temperature of 200° C. or more and being excellent in heat resistance are also preferable.

As for the inorganic filler useful in this invention, quartz glass, crystalline silica, fused silica, glass, alumina, calcium silicate, barium sulfate, magnesia, nitrogen silicate, aluminum nitride, aluminum oxide, magnesium oxide, mica and metals can be employed. Among them, spherical or semi-spherical fillers are more preferable, since these fillers are effective in lowering the viscosity of the resin composition. Although the employment of crushed silica is generally preferable in view of enhancing the mechanical strength of the resin composition, the active surface of the semiconductor element may be damaged by the flow of the crushed silica. Since the resin composition is forced to flow through a narrow space between a semiconductor element and a substrate in the manufacturing method of this invention, the employment of spherical or semi-spherical fillers is most preferable.

There is also an optimum range with respect to the maximum particle diameter of fillers to be incorporated in the sealing resin composition. For example, if the sealing of semiconductor element is performed employing a sealing resin composition containing a filler whose maximum particle diameter is larger than the interval between the semiconductor element and the substrate, the flow of the sealing resin composition would be intercepted at a midway, thus making it impossible to completely seal the semiconductor element without leaving an unfilled portion where the sealing resin is missing. Accordingly, the maximum particle diameter of fillers should be smaller than the interval between the semiconductor element and the substrate. More specifically, the maximum particle diameter of fillers should preferably be not more than 95% of the aforementioned interval. When the distance which a sealing resin is required to run through is relatively long as in the case where a large package having a dimension of 15 mm×15 mm is to be manufactured, the maximum particle diameter of fillers should preferably be not more than 80% of the aforementioned interval.

The mixing ratio of the inorganic filler in the sealing resin composition to be employed in this invention should preferably be 50% by weight or more based on the entire resin composition. Particularly, if a reflow is to be performed, the mixing ratio of the inorganic filler in the sealing resin composition should preferably be 70% by weight or more in view of reducing the water content absorbed in the sealing resin layer. Further, where a large package having a dimension of 15 mm×15 mm is to be sealed with a sealing resin, the mixing ratio of the inorganic filler in the sealing resin composition should preferably be 80% by weight or more. In order to facilitate the flow of sealing resin through a narrow space between a semiconductor element and a substrate, the mixing ratio of spherical fillers in the entire fillers should preferably be 50% by weight or more. Since the employment of crushed silica gives rise to a problem of damage on the active surface of the semiconductor element by the flow of sealing resin, the content of the crushed silica should preferably be as small as possible. When the distance which a sealing resin is required to run through is relatively long as in the case where a large package having a dimension of 15 mm×15 mm is to be manufactured, at least 70% by weight of the entire fillers should preferably be occupied by spherical fillers.

If a flame retardant is to be incorporated in the sealing resin composition in this invention, a halogen type, phosphorus type or inorganic type flame retardant can be preferably employed. The halogen type flame retardant can be generally classified into a bromine type flame retardant and a chlorine type flame retardant. The bromine type flame retardant is high in flame-retarding efficiency as compared with the chlorine type flame retardant, and exhibits a synergistic effect when it is jointly used with antimony trioxide. Preferable example of the chlorine type flame retardant is chlorinated paraffin. Most preferable example of the halogen type flame retardant is a brominated bisphenol A type epoxy resin.

In a preparation of a liquid resin composition from the aforementioned components, the components comprising for instance epoxy resin, a curing agent, a cure accelerator, a flame retardant, a filler, a low stress additive and a colorant are mixed together in a universal mixture to obtain a liquid resin composition. On the other hand, a solid resin composition can be obtained by a process comprising the steps of mixing the components comprising for instance epoxy resin, a curing agent, a cure accelerator, a flame retardant, a filler, a low stress additive and a colorant in Henschel mixer, kneading the resultant mixture by making use of hot rollers, and pulverizing the kneaded mixture.

The viscosity of the sealing resin composition should preferably be 300 Pa·s or less at the molding temperature. When the distance which a sealing resin is required to run through is relatively long as in the case of a large package, the viscosity of the sealing resin composition should preferably be 100 Pa·s or less at the molding temperature. If the viscosity of the resin is higher than this upper limit, an unfilled portion missing of sealing resin or a void may be generated in the resultant resin layer, or a peeling may be generated at the bump which is formed for connecting a semiconductor element with a substrate.

The temperature for molding the package should preferably be in the range of about 150 to 185° C. Because, if this molding temperature is lower than this lower limit, the molding time may be prolonged, whereas if this molding temperature is higher than this upper limit, the characteristics of the sealing resin such as mechanical strength would be deteriorated or the sealing resin may be cured before it is pressed by means of a press mold since the curing time is shortened.

The sealing resin which has been conditioned to have a predetermined viscosity as mentioned above is then formed into a solid sheet-like form, a solid bulky form, a granular form or a highly viscous form, and subsequently placed on the bottom surface of the semiconductor element. In this case, the solid sheet-like form of the resin can be obtained by rolling the resin by means of a press or rollers so as to obtain a sheet having a predetermined thickness, which is subsequently cut into a size having the same dimension as that of the cavity of mold. The thickness of this sheet may be suitably determined depending on the size of the semiconductor element or on the size of a package to obtain. For example, when the size of the semiconductor element is 10 mm×10 mm, and the size of a package is 12 mm×12 mm, the thickness of the sheet may be about 0.5 mm. When the sealing resin is applied to the cavity of mold in the form of sheet, the flow distance of the sealing resin can be minimized, thus making it advantageous. However, since the resin sheet thus formed is very thin, care has to be taken in handling it so as avoid the cracking of the resin sheet.

The solid bulky form of sealing resin can be prepared by a method wherein a sealing resin is molded into a relatively thick sheet, which is then cut into pieces of predetermined size, or by a method wherein a sealing resin is compressed into a bulky form in the same manner as ordinarily performed for preparing tablets. The flow distance of sealing resin may be somewhat elongated by the employment of the solid bulky form of sealing resin as compared where the aforementioned resin sheet is employed. However, the cracking of the bulky sealing resin can be extremely minimized.

The granular form of sealing resin is convenient in conforming with changes in shape and size of the package. Furthermore, the employment of the granular form of sealing resin is advantageous in avoiding the generation of fine power of the resin and in regulating the quantity of sealing resin to be fed since the quantity thereof can be easily determined by the number of the sealing resin granules.

As for the shape of the sealing resin granules, it may be spherical, semi-spherical, columnar or prismatic. Among them, the employment of columnar sealing resin granules is advantageous since the conventional apparatus for manufacturing tablets can be used as it is. Further, the columnar sealing resin granules can be easily molded by means of extrusion molding and cutting. On the other hand, the spherical or semi-spherical sealing resin can be hardly fractured since it is free from any angular portion, and is excellent in fluidity, thus enabling it to be easily fed into a mold.

If the granular sealing resin is too fine in size, the quantity of the sealing resin can hardly be measured by counting the number of the granules. On the other hand, if the granular sealing resin is too large in size, a delicate adjustment of quantity becomes no more possible, so that it cannot be adapted to changes in size of the package. Therefore, the size of the granular sealing resin should preferably be in the range of 1 mm$^3$ to 100 mm$^3$.

The employment of liquid sealing resin is advantageous in the respects that it is free from the scattering of resin powder and from the fracturing of resin. Furthermore, the quantity of sealing resin to be fed can be delicately controlled, so that it can be adapted to any size of the package without necessitating a trouble of changing the size of resin sheet. However, it may be desirable to increase more or less the viscosity of liquid resin in order to avoid the liquid resin supplied onto the bottom surface of semiconductor element from spilling at the occasion of accommodating it into a mold. If the liquid sealing resin is to be supplied onto the bottom surface of semiconductor element immediately before it is accommodated into a mold, the viscosity of the liquid resin may not be so high. However, if the time interval between the moment of supplying of the liquid resin onto the bottom surface of semiconductor element and the moment of accommodating the semiconductor element in a mold is fairly long, the liquid sealing resin is required to be made higher in viscosity. Specifically, a preferable range of the viscosity of sealing resin is 100 Pa·s or more (at room temperature) if the liquid sealing resin is to be supplied immediately before it is accommodated into a mold. On the other hand, if the liquid sealing resin is to be supplied and left for a while before it is accommodated into a mold, a preferable range of the viscosity is 300 Pa·s or more (at room temperature). When the sealing resin is fed onto the semiconductor element in this manner, the viscosity of the sealing resin can be further lowered at the molding temperature of the package, so that an excellent filling of the sealing resin layer would be resulted after the molding.

The volume of the sealing resin composition to. be fed onto the semiconductor element should preferably be slightly larger than the available space volume of the cavity (a volume to be obtained when the volume of the semiconductor element is subtracted from the volume of the cavity of mold). Namely, if the available space volume of the cavity is completely equal to the volume of the sealing resin, it is difficult to apply a sufficient pressure to the sealing resin to the end and hence to force the sealing resin to flow deeply into a narrow space between the semiconductor element and the substrate, thus possibly generating voids and unfilled portion missing of sealing resin. Specifically, the volume of the sealing resin composition to be fed onto the semiconductor element should preferably be larger than the available space volume of the cavity by 1 to 5%.

As for the kinds of package to be employable in this invention, any kinds of package can be employed as long as a semiconductor element can be mounted facedown on a substrate. For example, a BGA (ball grid array), a CSP (chip size package), a COG (chip on glass) or a COB (chip on board) may be employed.

The employment of transfer molding which is complicated in structure and requires a relatively large mold is not suited for manufacturing a package of a semiconductor element, particularly for manufacturing the packages of COG and COB, among these packages, where a semiconductor element is to be directly mounted on a large substrate formed of a wiring substrate or a glass substrate. Because, according to the transfer molding, a mold thereof is caused to contact with an attachment of the substrate. Under the circumstances, the employment of other sealing method requiring a small and simple mold is desired. Therefore, this invention can be advantageously employed for manufacturing the packages of COG and COB.

According to the method of this invention, a substrate on which a semiconductor element is mounted facedown via bumps is positioned together with a sealing resin in a mold, and a pressure is applied directly on the sealing resin, so that the sealing resin is permitted to flow into a narrow space between the semiconductor element and the substrate. Moreover, since the pressed sealing resin is forced to flow from four sides of the semiconductor element all at once toward the center of the space of opposite side according to one embodiment of this invention, the molding time can be shortened. Furthermore, since a resin of high viscosity can be fed into the mold according to this invention, a sealing resin containing a high ratio of a filler excellent in reflow resistance can be employed. As a result, it is now possible according to this invention to manufacture a package excellent in reliability. Additionally, the thickness of sealing resin between a semiconductor element and the substrate is suitably controlled in relative to the thickness of the sealing resin formed on the bottom surface of the semiconductor element, thereby making it possible to enhance the mechanical strength of the package and at the same time, to minimize the warpage of the package.

Since the sealing resin can be fed into a mold in a granular form or in a liquid state, it can be easily conformed with changes in shape and size of the package, thereby enhancing the flexibility of employment.

When a frame-like mold provided with an air vent is employed, or when a through-hole is formed in a substrate so as to allow a sealing resin to be forcibly introduced therethrough, it is possible to easily fill the space between a semiconductor element and the substrate without necessitating the evacuation of the mold.

When the shape of the press mold is made columnar, the mold can be worked in high precision, so that a package which is substantially free from a longitudinal burr can be obtained, and at the same time, the cleaning of the mold can be extremely reduced in frequency.

This invention will be further explained in detail with reference to the following examples and comparative examples.

First of all, the following materials are employed as raw materials to prepare the sealing resin compositions 1 to 13 according to the formulations shown in the following Tables 1 and 2.

A first epoxy resin: Epicoat (EP) 807 (trademark, bisphenol F type, epoxy equivalent: 174, viscosity: 3 Pa·s, Yuka Shell Epoxy Kabushikikaisha);

A second epoxy resin: YX-4000H (trademark, 4,4'-bis-(2,3-propoxy)-3,3',5,5'-tetramethylbiphenyl, epoxy equivalent: 193, Yuka Shell Epoxy Kabushikikaisha);

A flame-retardant epoxy resin: AER-745 (brominated epoxy resin, flame-retardant point: 71° C., epoxy equivalent: 402, Asahi Chemicals Industries Co., Ltd.);

An acid anhydride: QH-200 (methyltetrahydrophthalate anhydride, equivalent: 80, viscosity: 3–6 Pa·s, Nippon Zeon Co., Ltd.);

Phenol resin: XL-225L (phenolaralkyl resin, softening point: 84° C., hydroxyl equivalent: 180, Mitsui Toatsu Chemicals Inc.);

Silane coupling agent: A-187 (UCC Co., Ltd.);

Colorant: Carbon black (CB-30);

Cure-accelerator: C17Z (heptadecyl imidazole, Shikoku Chemicals Corp.);

Mold release agent: Ester wax;

Flame retardant: Antimony trioxide;

Crushed silica: USG-5A (average particle diameter: 5 μm; maximum particle diameter: 20 μm)

Spherical silica: SC-O (average particle diameter: 30 μm; maximum particle diameter: 180 μm)

Spherical silica: FB-10S (average particle diameter: 10 μm; maximum particle diameter: 60 μm)

Spherical silica: MK-06 (average particle diameter: 5 μm; maximum particle diameter: 24 μm)

TABLE 1

| Composition | Resin 1 | Resin 2 | Resin 3 | Resin 4 | Resin 5 | Resin 6 | Resin 7 |
|---|---|---|---|---|---|---|---|
| EP-807 | | | | | | | 30 |
| YX-4000H | 45 | 45 | 45 | 45 | 45 | 45 | |
| QH-200 | | | | | | | 60 |
| AER-745 | 5 | 5 | 5 | 5 | 5 | 5 | |
| XL-225L | 40 | 40 | 40 | 40 | 40 | 40 | |
| A-187 | 3 | 3 | 3 | 3 | 3 | 3 | 3 |
| CB-30 | 3 | 3 | 3 | 3 | 3 | 3 | 3 |
| C17Z | 1 | 1 | 1 | 1 | 1 | 1 | 1 |
| Ester wax | 3 | 3 | 3 | 3 | 3 | 3 | 3 |
| Antimony trioxide | 2 | 3 | 5 | 8 | 5 | 5 | 5 |
| USG-5A | | | | | | | |
| SC-O | | | | | | 228 | |
| FB-10S | | | | | 228 | | |
| MK-06 | 98 | 147 | 228 | 392 | | | 228 |
| Ratio of filler (wt %) | 50 | 60 | 70 | 80 | 70 | 70 | 70 |
| Max. particle diameter (μm) | 24 | 24 | 24 | 24 | 60 | 180 | 24 |
| Viscosity (180° C.) (Pa·s) | 2 | 5 | 10 | 40 | 5 | 4 | 2 |

TABLE 2

| Composition | Resin 8 | Resin 9 | Resin 10 | Resin 11 | Resin 12 | Resin 13 |
|---|---|---|---|---|---|---|
| EP-807 | 30 | | | | | |
| YX-4000H | | 45 | 45 | 45 | 45 | 45 |
| QH-200 | 60 | | | | | |
| AER-745 | | 5 | 5 | 5 | 5 | 5 |
| XL-225L | | 40 | 40 | 40 | 40 | 40 |
| A-187 | 3 | 3 | 3 | 3 | 3 | 3 |
| CB-30 | 3 | 3 | 3 | 3 | 3 | 3 |
| C17Z | 1 | 1 | 1 | 1 | 1 | 1 |
| Ester wax | 3 | 3 | 3 | 3 | 3 | 3 |
| Antimony trioxide | 8 | 5 | 5 | 5 | 2 | 1 |
| USG-5A | | 170 | 120 | 80 | | |
| SC-O | | | | | | |
| FB-10S | | | | | | |
| MK-06 | 392 | 58 | 108 | 148 | 65 | 41 |
| Ratio of filler (wt %) | 80 | 70 | 70 | 70 | 40 | 30 |
| Max. particle diameter (μm) | 24 | 24 | 24 | 24 | 24 | 24 |
| Viscosity (180° C.) (Pa·s) | 8 | 50 | 30 | 20 | 1 | 0.5 |

The numeral values shown in these Tables respectively represent a mixing ratio (g).

First of all, the components were mixed together at a ratio shown in Tables 1 and 2, and then kneaded and pulverized by means of a twin-roll mill to obtain resin compositions in the cases of Resin Nos. 1–6. On the other hand, in the cases of Resin Nos. 7 and 8, the mixture of these components were kneaded by means of a universal mixer to obtain liquid compositions.

Figure 1:
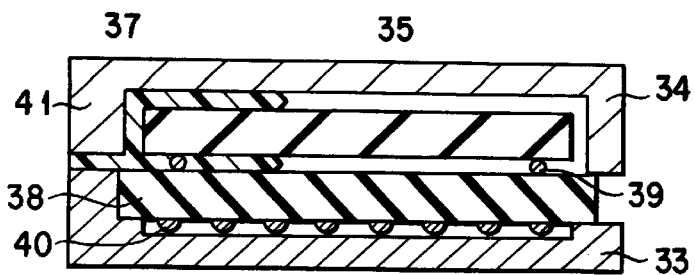
FIG. 1 is a cross-sectional view schematically illustrating a conventional transfer molding method.

Various kinds of packages were produced by making use of these resin compositions. Namely, the method according to this invention or the conventional method were employed for manufacturing the packages and at the same time, the dimension of semiconductor element and manufacturing conditions such as pressure were altered. As a method of producing a package according to this invention, either a method shown in FIGS. 2A to 2D wherein each resin composition was molded into a sealing resin sheet having a thickness of 1 mm or a method shown in FIGS. 4A to 4D was employed. In the case of a transfer molding, a resin composition was formed into a tablet at first and then the tablet was injected into a cavity by making use of a mold shown in FIG. 1. In any of these methods, the molding temperature was set to 180° C. In the case of potting, a liquid resin was dropped onto one side of the semiconductor element at a temperature of 60° C. without employing a mold, thereby allowing the liquid resin to flow into the space between the semiconductor element and the double-sided substrate by taking advantage of the surface tension of the liquid resin. Basically, all of the moldings were performed under the normal pressures. After the molding, the resins were post-cured for 8 hours at a temperature of 180° C., thereby obtaining packages. The thickness of the resin layer of each package was about 0.5 mm as measured from the surface of the substrate.

Subsequently, the following tests were performed on each package thus obtained, the results being shown in Tables 3 to 12.

(1) Moisture resistance reliability test after the reflow:

C. for 30 seconds. Then, each package was then subjected to a thermal shock cycle, one cycle thereof being consisted of −65° C./room temperature/150° C. This cycle was repeated 200 to 1,000 times to determine the percent defective by checking the performance characteristics of the device.

(3) Non-uniformity in thickness of package:

20 samples of each package were prepared, and the standard deviation of difference in thickness of these samples was calculated and tripled to obtain a value.

(4) Method of measuring the mechanical strength of the semiconductor element:

An iron ball (8 mm in diameter) was allowed to fall from a distance of 20 cm upward on the bottom surface of the semiconductor element covered with a sealing resin, and then the bottom surface of the semiconductor element was observed with the naked eye to see if there is any cracking.

(5) Method of measuring the warpage of BGA package:

A BGA package encapsulated with a resin was placed on a flat table, and a gap between the flat table and a portion of the package which indicated the most distanced was measured.

TABLE 3

|  | Example 1 | Example 2 | Example 3 | Example 4 | Comparative Example 1 | Comparative Example 2 | Comparative Example 3 | Comparative Example 4 | Reference Example 1 | Reference Example 2 |
|---|---|---|---|---|---|---|---|---|---|---|
| Resin composition | Resin 1 | Resin 2 | Resin 3 | Resin 4 | Resin 1 | Resin 2 | Resin 3 | Resin 4 | Resin 12 | Resin 13 |
| Molding method | This invention | This invention | This invention | This invention | Transfer | Transfer | Transfer | Transfer | This invention | This invention |
| Interval between semiconductor element and substrate ($\mu$m) | 30 | 30 | 30 | 30 | 30 | 30 | 30 | 30 | 30 | 30 |
| Size (mm□) | 10 | 10 | 10 | 10 | 10 | 10 | 10 | 10 | 10 | 10 |
| Ratio of filling defective package (defectives/samples) | 0/20 | 0/20 | 0/20 | 0/20 | 1/20 | 3/20 | 5/20 | 9/20 | 1/20 | 4/20 |
| Thermal shock cycle test after reflow (defectives/samples) Number of cycle |  |  |  |  |  |  |  |  |  |  |
| 100 | 0/20 | 0/20 | 0/20 | 0/20 | 1/20 | 3/20 | 6/20 | 10/20 | 1/20 | 4/20 |
| 200 | 0/20 | 0/20 | 0/20 | 0/20 | 1/20 | 3/20 | 6/20 | 12/20 | 1/20 | 4/20 |
| 400 | 0/20 | 0/20 | 0/20 | 0/20 | 1/20 | 3/20 | 6/20 | 14/20 | 1/20 | 6/20 |
| 700 | 1/20 | 0/20 | 0/20 | 0/20 | 2/20 | 4/20 | 7/20 | 16/20 | 3/20 | 10/20 |
| 1000 | 2/20 | 1/20 | 0/20 | 0/20 | 2/20 | 6/20 | 9/20 | 18/20 | 3/20 | 13/20 |
| Pressure cooker test after reflow (defectives/samples) Time |  |  |  |  |  |  |  |  |  |  |
| 100 | 0/20 | 0/20 | 0/20 | 0/20 | 1/20 | 3/20 | 5/20 | 11/20 | 1/20 | 5/20 |
| 200 | 0/20 | 0/20 | 0/20 | 0/20 | 1/20 | 4/20 | 5/20 | 13/20 | 1/20 | 5/20 |
| 400 | 0/20 | 0/20 | 0/20 | 0/20 | 1/20 | 4/20 | 5/20 | 15/20 | 1/20 | 7/20 |
| 700 | 1/20 | 0/20 | 0/20 | 0/20 | 1/20 | 5/20 | 8/20 | 16/20 | 3/20 | 10/20 |
| 1000 | 2/20 | 1/20 | 0/20 | 0/20 | 2/20 | 5/20 | 10/20 | 19/20 | 3/20 | 11/20 |

Each package was left in an atmosphere 85% in relative humidity and 85° C. in temperature for 168 hours. Then, each package was dipped into a solder bath heated to 240° C. for 30 seconds. Then, each package was kept in a pressure cooker which was filled with a saturated water vapor heated to 127° C. for 200 to 1,000 hours, after which the performance characteristics of the package was checked to investigate the percent defective.

(2) Thermal shock cycle test after the reflow:

Each package was left in an atmosphere 85% in relative humidity and 85° C. in temperature for 168 hours. Then, each package was dipped into a solder bath heated to 240°

Table 3 shows the results measured on reliability of the packages that have been produced according to the method (FIGS. 2A to 2D) of this invention and that have been produced according the transfer molding method. In any of these methods, the moldings were performed under the normal pressure.

As shown in Table 3, the packages molded according to this invention (Examples 1 to 4) were found substantially free from any defects, whereas the packages molded according to the transfer molding method (Comparative Examples 1 to 4) indicated the generation of an unfilled portion missing of sealing resin. Accordingly, an increased number of defectives were found in the thermal shock cycle test and also in the pressure cooker test after the reflow. With respect to the packages which have been encapsulated by making use of a sealing resin of high viscosity containing an increased mixing ratio of filler (Comparative Examples 3 and 4), the defectives were further increased. In the case of examples according to this invention where a sealing resin containing less than 70% of a filler was employed (Examples 1 and 2), a small number of defectives were also recognized in the latter half stage of the test after the reflow. It will be seen from these results that the mixing ratio of filler should more preferably be 70% or more. As shown in Reference Examples 1 and 2, when the mixing ratio of the filler in the resin was less than 50% by weight, the generation of defectives was recognized even if these packages had been manufactured according to the method of this invention. It will be seen from these results that the mixing ratio of filler is desired to be 50% or more based on the sealing resin.

TABLE 4

|  | Example 5 | Example 6 | Example 7 | Example 8 |
|---|---|---|---|---|
| Resin composition | Resin 3 | Resin 4 | Resin 5 | Resin 6 |
| Molding method | This invention | This invention | This invention | This invention |
| Interval between semiconductor element and substrate ($\mu$m) | 30 | 30 | 30 | 30 |
| Size (mm□) | 10 | 10 | 20 | 20 |
| Ratio of filling defective package (defectives/samples) | 0/20 | 0/20 | 0/20 | 0/20 |
| Thermal shock cycle test after reflow (defectives/samples) Number of cycle | | | | |
| 100 | 0/20 | 0/20 | 0/20 | 0/20 |
| 200 | 0/20 | 0/20 | 0/20 | 0/20 |
| 400 | 0/20 | 0/20 | 0/20 | 0/20 |
| 700 | 0/20 | 0/20 | 0/20 | 0/20 |
| 1000 | 0/20 | 0/20 | 0/20 | 0/20 |
| Pressure cooker test after reflow (defectives/samples) Time | | | | |
| 100 | 0/20 | 0/20 | 0/20 | 0/20 |
| 200 | 0/20 | 0/20 | 0/20 | 0/20 |
| 400 | 0/20 | 0/20 | 0/20 | 0/20 |
| 700 | 0/20 | 0/20 | 0/20 | 0/20 |
| 1000 | 0/20 | 0/20 | 0/20 | 0/20 |
|  | Comparative Example 5 | Comparative Example 6 | Comparative Example 7 | Comparative Example 8 |
| Resin composition | Resin 5 | Resin 6 | Resin 7 | Resin 8 |
| Molding method | Potting | Potting | Potting | Potting |
| Interval between semiconductor element and substrate ($\mu$m) | 30 | 30 | 30 | 30 |
| Size (mm□) | 10 | 10 | 10 | 10 |
| Ratio of filling defective package (defectives/samples) | 0/20 | 0/20 | 9/20 | 12/20 |
| Thermal shock cycle test after reflow (defectives/samples) Number of cycle | | | | |
| 100 | 0/20 | 0/20 | 12/20 | 13/20 |
| 200 | 0/20 | 0/20 | 14/20 | 15/20 |
| 400 | 0/20 | 0/20 | 17/20 | 17/20 |
| 700 | 0/20 | 2/20 | 17/20 | 19/20 |
| 1000 | 1/20 | 2/20 | 19/20 | 19/20 |
| Pressure cooker test after reflow (defectives/samples) Time | | | | |
| 100 | 0/20 | 0/20 | 13/20 | 14/20 |
| 200 | 0/20 | 0/20 | 15/20 | 16/20 |
| 400 | 1/20 | 2/20 | 19/20 | 19/20 |
| 700 | 1/20 | 3/20 | 20/20 | 20/20 |
| 1000 | 2/20 | 5/20 | 20/20 | 20/20 |

Table 4 shows the results measured on reliability of the packages that have been produced according to the method (FIGS. 2A to 2D) of this invention and that have been produced according to the potting method.

As shown in Table 4, the packages molded according to this invention (Examples 5 to 8) were found completely free from any defects, whereas the packages molded according to the potting method (Comparative Examples 5 to 8) indicated the generation of defective products. Among these Comparative Examples, the packages of Comparative Examples 5 and 6 where a sealing resin containing an acid anhydride which is poor in reliability indicated an excellent filling of the resin in the beginning, but the properties of the resin were gradually deteriorated as the time and the number of cycle were increased in the thermal shock cycle test and in the pressure cooker test after the reflow, thus generating an increased number of defectives. With respect to the packages of Comparative Examples 7 and 8 where a semiconductor element of large size (20 mm×20 mm) was employed, the liquid resin failed to be introduced throughout the space between the semiconductor element and the substrate, thus increasing ratio of defectives which were insufficiently filled with the resin. Furthermore, since an acid anhydride was employed in these comparative examples, the number of defectives was further increased in the tests performed after the reflow.

As illustrated above, since a resin which is free from acid anhydride and excellent in property can be employed in the method (FIGS. 2A to 2D) of this invention, a package exhibiting an excellent heat resistance can be obtained.

TABLE 5

|  | Example 9 | Example 10 | Example 11 |
|---|---|---|---|
| Resin composition | Resin 3 | Resin 5 | Resin 6 |
| Molding method | This invention | This invention | This invention |
| Maximum grain diameter of filler ($\mu$m) | 24 | 60 | 180 |
| Interval between semiconductor element and substrate ($\mu$m) | 30 | 80 | 200 |
| Size (mm□) | 10 | 10 | 10 |
| Ratio of filling defective package (defectives/samples) | 0/20 | 0/20 | 0/20 |
| Thermal shock cycle test after reflow (defectives/samples) Number of cycle | | | |
| 100 | 0/20 | 0/20 | 0/20 |
| 200 | 0/20 | 0/20 | 0/20 |
| 400 | 0/20 | 0/20 | 0/20 |
| 700 | 0/20 | 0/20 | 0/20 |
| 1000 | 0/20 | 0/20 | 0/20 |

TABLE 5-continued

Pressure cooker test after reflow (defectives/samples)
Time

| | | | |
|---|---|---|---|
| 100 | 0/20 | 0/20 | 0/20 |
| 200 | 0/20 | 0/20 | 0/20 |
| 400 | 0/20 | 0/20 | 0/20 |
| 700 | 0/20 | 0/20 | 0/20 |
| 1000 | 0/20 | 0/20 | 0/20 |

| | Reference Example 3 | Reference Example 4 | Reference Example 5 |
|---|---|---|---|
| Resin composition | Resin 3 | Resin 5 | Resin 6 |
| Molding method | This invention | This invention | This invention |
| Maximum grain diameter of filler ($\mu$m) | 24 | 60 | 180 |
| Interval between semiconductor element and substrate ($\mu$m) | 20 | 50 | 100 |
| Size (mm□) | 10 | 10 | 10 |
| Ratio of filling defective package (defectives/samples) | 19/20 | 18/20 | 20/20 |

Thermal shock cycle test after reflow (defectives/samples)
Number of cycle

| | | | |
|---|---|---|---|
| 100 | 19/20 | 18/20 | 20/20 |
| 200 | 20/20 | 20/20 | 20/20 |
| 400 | 20/20 | 20/20 | 20/20 |
| 700 | 20/20 | 20/20 | 20/20 |
| 1000 | 20/20 | 20/20 | 20/20 |

Pressure cooker test after reflow (defectives/samples)
Time

| | | | |
|---|---|---|---|
| 100 | 19/20 | 19/20 | 20/20 |
| 200 | 19/20 | 20/20 | 20/20 |
| 400 | 20/20 | 20/20 | 20/20 |
| 700 | 20/20 | 20/20 | 20/20 |
| 1000 | 20/20 | 20/20 | 20/20 |

Table 5 illustrates the relationship between a maximum particle diameter of filler that has been incorporated into the resin composition and the magnitude of distance between the semiconductor element and the substrate. These packages were manufactured by the method shown in FIGS. 2A to 2D.

In Examples 9 to 11, the semiconductor element was sealed by making use of a resin containing a filler whose maximum particle diameter (R) was set to smaller than 95% of the distance (L) between the semiconductor element and the substrate. As a result, an un-filled portion missing of sealing resin was not recognized after the molding of package, and any defective was not recognized even in the tests after the reflow. On the other hand, in the Reference Examples 3 to 5 wherein the semiconductor element was sealed by making use of a resin containing a filler whose maximum particle diameter (R) was set to 95% or more of the distance (L) between the semiconductor element and the substrate, most of the resin could not flow into the space between the semiconductor element and the substrate, thus generating defectives due to the insufficient filling of the resin.

TABLE 6

| | Example 12 | Example 13 | Example 14 | Example 15 |
|---|---|---|---|---|
| Resin composition | Resin 3 | Resin 3 | Resin 3 | Resin 3 |
| Molding method | This invention vacuum | This invention vacuum | This invention vacuum | This invention vacuum |
| Interval between semiconductor element and substrate ($\mu$m) | 30 | 30 | 30 | 30 |
| Size (mm□) | 10 | 20 | 30 | 40 |
| Ratio of filling defective package (defectives/samples) | 0/20 | 0/20 | 0/20 | 0/20 |

Thermal shock cycle test after reflow (defectives/samples)
Number of cycle

| | | | | |
|---|---|---|---|---|
| 100 | 0/20 | 0/20 | 0/20 | 0/20 |
| 200 | 0/20 | 0/20 | 0/20 | 0/20 |
| 400 | 0/20 | 0/20 | 0/20 | 0/20 |
| 700 | 0/20 | 0/20 | 0/20 | 0/20 |
| 1000 | 0/20 | 0/20 | 0/20 | 0/20 |

Pressure cooker test after reflow (defectives/samples)
Time

| | | | | |
|---|---|---|---|---|
| 100 | 0/20 | 0/20 | 0/20 | 0/20 |
| 200 | 0/20 | 0/20 | 0/20 | 0/20 |
| 400 | 0/20 | 0/20 | 0/20 | 0/20 |
| 700 | 0/20 | 0/20 | 0/20 | 0/20 |
| 1000 | 0/20 | 0/20 | 0/20 | 0/20 |

| | Reference Example 6 | Reference Example 7 | Reference Example 8 | Reference Example 9 |
|---|---|---|---|---|
| Resin composition | Resin 3 | Resin 3 | Resin 3 | Resin 3 |
| Molding method | This invention atmospheric pressure | This invention atmospheric pressure | This invention atmospheric pressure | This invention atmospheric pressure |
| Interval between semiconductor element and substrate ($\mu$m) | 30 | 30 | 30 | 30 |
| Size (mm□) | 10 | 20 | 30 | 40 |
| Ratio of filling defective package (defectives/samples) | 0/20 | 0/20 | 6/20 | 18/20 |

Thermal shock cycle test after reflow (defectives/samples)
Number of cycle

| | | | | |
|---|---|---|---|---|
| 100 | 0/20 | 0/20 | 6/20 | 19/20 |
| 200 | 0/20 | 0/20 | 6/20 | 19/20 |
| 400 | 0/20 | 0/20 | 6/20 | 20/20 |
| 700 | 0/20 | 0/20 | 7/20 | 20/20 |
| 1000 | 0/20 | 0/20 | 9/20 | 20/20 |

Pressure cooker test after reflow (defectives/samples)
Time

| | | | | |
|---|---|---|---|---|
| 100 | 0/20 | 0/20 | 5/20 | 18/20 |
| 200 | 0/20 | 0/20 | 5/20 | 18/20 |
| 400 | 0/20 | 0/20 | 8/20 | 19/20 |
| 700 | 0/20 | 0/20 | 9/20 | 20/20 |
| 1000 | 0/20 | 0/20 | 10/20 | 20/20 |

Table 6 illustrates the ratio of generating defectives when the packages were manufactured in a vacuum and when the packages were manufactured under the normal pressure. These packages were manufactured by the method shown in FIGS. 2A to 2D.

The packages of Examples 12 to 15, which were manufactured in a vacuum indicated an excellent filling of the resin, so that defective was not recognized at all even if the size of chip was as large as 40 mm×40 mm. On the other hand, in the case of the packages which were manufactured under the normal pressure, an unfilled portion missing of sealing resin was not recognized when the size of chip was not more than 20 mm×20 mm (Reference Examples 6 and 7). However, when the size of chip was increased to 30 mm×30 mm or more, an unfilled portion missing of sealing resin was recognized due to a residual air remaining at a space between the semiconductor element and the double-sided substrate. As a result, in the case of the packages which were manufactured under the normal pressure using a chip having a size of 30 mm×30 mm or more (Reference Examples 8 and 9), a large number of defectives were recognized in the tests after the reflow.

It will be seen from these results that if the encapsulation of semiconductor element is performed in a vacuum, even a semiconductor element of large size can be satisfactorily sealed with a resin without leaving an air void.

TABLE 7

|  | Example 16 | Example 17 | Reference Example 10 | Reference Example 11 |
|---|---|---|---|---|
| Resin composition | Resin 3 | Resin 3 | Resin 3 | Resin 3 |
| Air vent | Formed | Formed | None | None |
| Interval between semiconductor element and substrate ($\mu$m) | 30 | 30 | 30 | 30 |
| Size (mm□) | 30 | 40 | 45 | 58 |
| Non-uniformity of package ($\mu$m) | 10 | 15 | 30 | 40 |
| Ratio of filling defective package (defectives/samples) | 0/20 | 0/20 | 6/20 | 18/20 |
| Thermal shock cycle test after reflow (defectives/samples) Number of cycle |  |  |  |  |
| 100 | 0/20 | 0/20 | 6/20 | 19/20 |
| 200 | 0/20 | 0/20 | 6/20 | 19/20 |
| 400 | 0/20 | 0/20 | 6/20 | 20/20 |
| 700 | 0/20 | 0/20 | 7/20 | 20/20 |
| 1000 | 0/20 | 0/20 | 9/20 | 20/20 |
| Pressure cooker test after reflow (defectives/samples) Time |  |  |  |  |
| 100 | 0/20 | 0/20 | 5/20 | 18/20 |
| 200 | 0/20 | 6/20 | 5/20 | 18/20 |
| 400 | 0/20 | 0/20 | 8/20 | 19/20 |
| 700 | 0/20 | 6/20 | 9/20 | 20/20 |
| 1000 | 0/20 | 0/20 | 10/20 | 20/20 |

Table 7 illustrates the results studied on the reliability of packages which were manufactured under the normal pressure using a substrate with or without an air vent. Namely, in the cases of Examples 16 and 17, the packages were produced according to a process shown in FIGS. 4A to 4D. Specifically, in the case of Example 16, a substrate provided at the center portion thereof with a through-hole having a diameter of 0.02 mm was employed, whereas in the case of Example 17, a substrate provided at the center portion thereof with a through-hole having a diameter of 0.02 mm was employed.

As shown in Table 7, the packages which had been manufactured by making use of a substrate provided with an air vent (Examples 16 and 17) were free from any unfilled portion missing of sealing resin even if a semiconductor element of large size (30 mm×30 mm or more) was employed. Since this air vent also functioned to allow any excessive resin to escape into the air vent, the non-uniformity in thickness of the package could be minimized. Furthermore, due to the provision of air vent, the adhesion between the resin layer and the substrate was improved, and hence any defective was not recognized even in the tests after the reflow.

By contrast, the packages which had been manufactured by making use of a substrate without an air vent (Reference Examples 10 and 11) indicated the generation of unfilled portion missing of sealing resin and air void due to the residual air that had failed to escape. Furthermore, the non-uniformity in thickness of the package was at least three time larger than that of Examples 16 and 17. The adhesion between the semiconductor element and the substrate was also poor, and hence the number of defectives was increased as the cycle and time of the tests were continued.

TABLE 8

|  | Example 18 | Example 19 | Example 20 | Example 21 |
|---|---|---|---|---|
| Resin composition | Resin 3 | Resin 3 | Resin 3 | Resin 3 |
| Thickness of resin of bottom surface of semi-conductor element ($\mu$m) | 40 | 50 | 60 | 70 |
| Thickness of resin between semiconductor element and substrate ($\mu$m) | 30 | 30 | 30 | 30 |
| Thickness of resin on bottom of semiconductor element ($\mu$m)/ thickness of resin between semiconductor element and substrate ($\mu$m) | 1.33 | 1.67 | 2.00 | 2.33 |
| Thickness (mm) | 0.3 | 0.3 | 0.3 | 0.3 |
| Size (mm□) | 10 | 10 | 10 | 10 |
| Ratio of cracked samples (defectives/samples) | 0/20 | 0/20 | 0/20 | 0/20 |

|  | Reference Example 12 | Reference Example 13 | Reference Example 14 | Reference Example 15 |
|---|---|---|---|---|
| Resin composition | Resin 3 | Resin 3 | Resin 3 | Resin 3 |
| Thickness of resin of bottom surface of semi-conductor element ($\mu$m) | 5 | 10 | 15 | 20 |
| Thickness of resin between semiconductor element and substrate ($\mu$m) | 30 | 30 | 30 | 30 |
| Thickness of resin on bottom of semiconductor element ($\mu$m)/ thickness of resin between semiconductor element and substrate ($\mu$m) | 0.16 | 0.33 | 0.50 | 0.67 |
| Thickness (mm) | 0.3 | 0.3 | 0.3 | 0.3 |
| Size (mm□) | 10 | 10 | 10 | 10 |
| Ratio of cracked samples (defectives/samples) | 12/20 | 8/20 | 3/20 | 1/20 |

Table 8 illustrates the mechanical strength measured of the packages manufactured using a thin semiconductor element, wherein the thickness of the resin layer to be formed on the bottom surface of the element was altered for comparison. These packages were manufactured by the method shown in FIGS. 2A to 2D.

The thickness of the resin layer formed on the bottom surface of the element was larger than that of the resin layer formed between the semiconductor element and the substrate (Examples 18 to 21), a cracking of the resin layer was not recognized at all. On the other hand, when the thickness of the resin layer formed on the bottom surface of the element was smaller than that of the resin layer formed between the semiconductor element and the substrate (Reference Examples 12 to 15), a cracking of the resin layer was recognized in all of the samples. The ratio of generating a cracking was increased as the thickness of resin on the bottom surface of the semiconductor element was made thinner.

TABLE 9

|  | Example 22 | Example 23 | Example 24 | Example 25 |
| --- | --- | --- | --- | --- |
| Resin composition | Resin 3 | Resin 3 | Resin 3 | Resin 3 |
| Thickness of resin of bottom surface of semiconductor element (μm) | 5 | 10 | 15 | 20 |
| Thickness of resin between semiconductor element and substrate (μm) | 30 | 30 | 30 | 30 |
| Thickness of resin on bottom of semiconductor element (μm)/thickness of resin between semiconductor element and substrate (μm) | 0.16 | 0.33 | 0.50 | 0.67 |
| Thickness (min) | 0.5 | 0.5 | 0.5 | 0.5 |
| Size (mm□) | 40 | 40 | 40 | 40 |
| Warpage (μm) | 2 | 4 | 14 | 23 |

|  | Reference Example 16 | Reference Example 17 | Reference Example 18 | Reference Example 19 |
| --- | --- | --- | --- | --- |
| Resin composition | Resin 3 | Resin 3 | Resin 3 | Resin 3 |
| Thickness of resin of bottom surface of semiconductor element (μm) | 40 | 50 | 60 | 70 |
| Thickness of resin between semiconductor element and substrate (μm) | 30 | 30 | 30 | 30 |
| Thickness of resin on bottom of semiconductor element (μm)/thickness of resin between semiconductor element and substrate (μm) | 1.33 | 1.67 | 2.00 | 2.33 |
| Thickness (mm) | 0.5 | 0.5 | 0.5 | 0.5 |
| Size (mm□) | 40 | 40 | 40 | 40 |
| warpage (μm) | 70 | 120 | 186 | 255 |

Table 9 illustrates the warpage measured of the packages manufactured using a large semiconductor element, wherein the thickness of the resin layer to be formed on the bottom surface of the element was altered for comparison. These packages were manufactured by the method shown in FIGS. 2A to 2D.

When the thickness of the resin layer formed on the bottom surface of the element was smaller than that of the resin layer formed between the semiconductor element and the substrate (Examples 22 to 25), only a slight degree of warpage was recognized. By the way, in the case of BGA package wherein a chip having a size of 40 mm×40 mm and a thickness of 0.5 mm was encapsulated, a warpage of up to 50 μm is considered as being allowable. On the other hand, when the thickness of the resin layer formed on the bottom surface of the element was larger than that of the resin layer formed between the semiconductor element and the substrate (Reference Examples 16 to 19), a warpage exceeding over the allowable range of the package was recognized in all of the samples. The degree of warpage was increased as the thickness of resin on the bottom surface of the semiconductor element was increased.

Based on the results obtained herein regarding the mechanical strength and the warpage, the present inventors have found a relationship between the size of semiconductor element and the thickness of the sealing resin layer as explained below. Namely, when a relationship represented by the following formula (2) is satisfied, it is possible to obtain a desirable package having a sufficient mechanical strength and exhibiting a minimal warpage.

$$30 < a t_c t_u / t_m < 800 \qquad (2)$$

wherein "a" is a plane area (mm$^2$) of a semiconductor element; $t_c$ is a thickness (mm) of the semiconductor element; $t_u$ is a thickness (mm) of a resin layer disposed on the bottom surface of the semiconductor element; and $t_m$ is a thickness (mm) of the resin layer disposed in a space between the semiconductor element and a substrate.

In the case of packages of Reference Examples 12 to 15 shown in Table 8 mentioned above, the thickness ($t_u$) of resin layer disposed on the bottom surface of the semiconductor element is small in relative to the small size (a) and thickness ($t_c$) of the semiconductor element. On the other hand, in the case of packages of Reference Examples 16 to 19 shown in Table 9 mentioned above, the thickness ($t_u$) of resin layer disposed on the bottom surface of the semiconductor element is large in relative to the size (a) and thickness ($t_c$) of the semiconductor element. In any ways, since these packages fail to meet the aforementioned formula (2), a large extent of cracking or warpage was recognized, thus failing to obtain a package having a sufficient reliability.

TABLE 10

|  | Example 26 | Example 27 | Reference Example 20 | Reference Example 21 |
| --- | --- | --- | --- | --- |
| Resin composition | Resin 3 | Resin 11 | Resin 9 | Resin 10 |
| Molding method | This invention | This invention | This invention | This invention |
| Maximum diameter of filler (μm) | 24 | 24 | 24 | 24 |
| Interval between semiconductor element and substrate (μm) | 30 | 30 | 30 | 30 |
| Size (mm□) | 10 | 10 | 10 | 10 |
| Ratio of filling defective package (defectives/samples) | 0/20 | 0/20 | 7/20 | 2/20 |
| Thermal shock cycle test after reflow (defectives/samples) Number of cycle |  |  |  |  |
| 100 | 0/20 | 0/20 | 8/20 | 3/20 |
| 200 | 0/20 | 0/20 | 10/20 | 3/20 |
| 400 | 0/20 | 0/20 | 11/20 | 4/20 |
| 700 | 0/20 | 0/20 | 15/20 | 6/20 |
| 1000 | 0/20 | 2/20 | 17/20 | 7/20 |
| Pressure cooker test after reflow (defectives/samples) Time |  |  |  |  |
| 100 | 0/20 | 0/20 | 10/20 | 2/20 |
| 200 | 0/20 | 0/20 | 11/20 | 2/20 |
| 400 | 0/20 | 0/20 | 15/20 | 5/20 |
| 700 | 0/20 | 0/20 | 16/20 | 6/20 |
| 1000 | 0/20 | 1/20 | 17/20 | 6/20 |

Table 10 illustrates the influence of filler added to a sealing resin on the reliability of package. The packages in Table 10 were manufactured by the method shown in FIGS. 2A to 2D.

The package of Example 26 was sealed by making use of a resin composition (Resin 3) wherein all of the filler added thereto was spherical in shape. The package of Example 27 was sealed by making use of a resin composition (Resin 11) wherein about 35% of the filler added thereto was crushed in shape. As shown in these examples, when a resin composition containing a higher ratio of spherical filler than that of crushed filler was employed, the filling of resin was excellent and the generation of defectives was not recognized even in the tests after the reflow.

On the other hand, in the case of packages (Reference Examples 20 and 21) wherein the mixing ratio of spherical filler in resin composition (Resins 9 and 10) was less than 50%, the fluidity of the resin composition was poor so that an unfilled portion missing of sealing resin was recognized, and hence a large number of defectives was recognized in the tests after the reflow.

TABLE 11

|  | Example 28 | Example 29 | Example 30 | Example 31 |
| --- | --- | --- | --- | --- |
| Resin composition | Resin 3 | Resin 3 | Resin 3 | Resin 3 |
| Size (mm□) | 40 | 40 | 40 | 40 |
| Diameter of through-hole ($\mu$m) | 5 | 10 | 15 | 20 |
| Interval between semiconductor element and substrate ($\mu$m) | 30 | 30 | 30 | 30 |
| Diameter of through-hole ($\mu$m)/thickness of resin semiconductor element and substrate ($\mu$m) | 0.16 | 0.33 | 0.50 | 0.67 |
| Ratio of filling defective package (defectives/samples) | 1/20 | 0/20 | 0/20 | 0/20 |

|  | Reference Example 22 | Reference Example 23 | Reference Example 24 | Reference Example 25 |
| --- | --- | --- | --- | --- |
| Resin composition | Resin 3 | Resin 3 | Resin 3 | Resin 3 |
| Size (mm□) | 40 | 40 | 40 | 40 |
| Diameter of through-hole ($\mu$m) | 40 | 50 | 60 | 70 |
| Interval between semiconductor element and substrate ($\mu$m) | 30 | 30 | 30 | 30 |
| Diameter of through-hole ($\mu$m)/thickness of resin semiconductor element and substrate ($\mu$m) | 1.33 | 1.67 | 2.00 | 2.33 |
| Ratio of filling defective package (defectives/samples) | 1/20 | 3/20 | 6/20 | 8/20 |

Table 11 illustrates the influence of the size of through-hole formed as an air vent in the substrate on the generation of unfilled portion missing of sealing resin in the manufacturing method shown in FIGS. 4A to 4D. When the size (inner diameter) of the through-hole was very small as in the case of Example 28, the discharge of air or resin through the through-hole was insufficient, so that an unfilled portion missing of sealing resin was recognized more or less. As shown in Examples 29 to 31, even if the diameter of the through-hole is enlarged, the unfilled portion would not be generated as long as the dimension thereof is limited to less than the thickness of the sealing resin layer disposed between the semiconductor element and the substrate. On the other hand, when the diameter of the through-hole was too large as shown in Reference Examples, the magnitude of unfilled portion missing of sealing resin was increased. This phenomenon can be ascribed to the fact that the pressed sealing resin flow can be easily escaped through this through-hole, thus making it difficult to sufficiently pressurize the sealing resin flow.

It will be seen from these results that there is an optimal range in the size of the through-hole, which can be determined depending on the thickness of the sealing resin layer disposed in a space between the semiconductor element and the substrate.

TABLE 12

|  | Example 32 | Example 33 | Example 34 | Example 35 |
| --- | --- | --- | --- | --- |
| Resin composition | Resin 3 | Resin 3 | Resin 3 | Resin 3 |
| Size (mm□) | 40 | 40 | 40 | 40 |
| Diameter of through-hole ($\mu$m) | 20 | 20 | 20 | 20 |
| Interval between semiconductor element and substrate ($\mu$m) | 30 | 30 | 30 | 30 |
| Distance of off-set of through-hole from center of semiconductor element/length of shorter side of semiconductor element | 0 | 1/20 | 1/10 | 1/7 |
| Ratio of filling defective package (defectives/samples) | 0/20 | 0/20 | 0/20 | 0/20 |

|  | Reference Example 26 | Reference Example 27 | Reference Example 28 | Reference Example 29 |
| --- | --- | --- | --- | --- |
| Resin composition | Resin 3 | Resin 3 | Resin 3 | Resin 3 |
| Size (mm□) | 40 | 40 | 40 | 40 |
| Diameter of through-hole ($\mu$m) | 20 | 20 | 20 | 20 |
| Interval between semiconductor element and substrate ($\mu$m) | 30 | 30 | 30 | 30 |
| Distance of offset of through-hole from center of semiconductor element/length of shorter side of semiconductor element | 1/4.5 | 1/4 | 1/3 | 1/2.5 |
| Ratio of filling defective package (defectives/samples) | 1/20 | 3/20 | 6/20 | 8/20 |

Table 12 illustrates a relationship between the location of through-hole formed as an air vent in the substrate and the generation of unfilled portion missing of sealing resin in the manufacturing method shown in FIGS. 4A to 4D. As shown in Examples 32 to 35, when the location of the through-hole was in the vicinity of the center of the semiconductor element, the generation of an unfilled portion missing of sealing resin was not recognized at all. However, when the location of the through-hole was off-set from the center of the semiconductor element, the through-hole was closed by the sealing resin flow at an early stage of the molding, thus leaving a residual air near the center of the substrate. Accordingly, as seen from the results of Reference Examples 26 to 29, the larger the distance between the through-hole and the center of the semiconductor element is, the higher the probability of generating the unfilled portion missing of sealing resin would be.

Next, the packages of Examples 36 to 41 were manufactured using granular or liquid resins in accordance with the process shown in FIGS. 2A to 2D, and the properties of the resultant packages were investigated.

Namely, the Resin 1, Resin 2 and Resin 3 prepared as mentioned above were molded into granular bodies of predetermined size. Then, five kinds of granular resin and a liquid resin (Resin 7) thus prepared were respectively applied to the cavity of mold which was kept vacuum in advance, thereby molding packages at a temperature of 180° C. After molding, the packages were post-cured for 8 hours at a temperature of 180° C. thereby completing the packages. The thickness of the resin layer of each package was about 0.5 mm as measured from the surface of the substrate.

Subsequently, the thermal shock cycle test and the pressure cooker test were performed on each package in the same manner as mentioned above, the results being summarized together with the ratio of filling-defective package in Table 13.

TABLE 13

|  | Example 36 | Example 37 | Example 38 |
|---|---|---|---|
| Resin composition | Resin 3 | Resin 3 | Resin 1 |
| Form of resin | 5 mm$^3$ Granule | 20 mm$^3$ Granule | 40 mm$^3$ Granule |
| Interval between semiconductor element and substrate ($\mu$m) | 30 | 30 | 30 |
| Size (mm□) | 30 | 30 | 30 |
| Ratio of filling defective package (defectives/samples) | 0/20 | 0/20 | 0/20 |
| Thermal shock cycle test after reflow (defectives/samples) Number of cycle | | | |
| 100 | 0/20 | 0/20 | 0/20 |
| 200 | 0/20 | 0/20 | 0/20 |
| 400 | 0/20 | 0/20 | 0/20 |
| 700 | 0/20 | 0/20 | 0/20 |
| 1000 | 0/20 | 0/20 | 0/20 |
| Pressure cooker test after reflow (defectives/samples) Time | | | |
| 100 | 0/20 | 0/20 | 0/20 |
| 200 | 0/20 | 0/20 | 0/20 |
| 400 | 0/20 | 0/20 | 6/20 |
| 700 | 0/20 | 0/20 | 0/20 |
| 1000 | 0/20 | 0/20 | 0/20 |

|  | Example 39 | Example 40 | Example 41 |
|---|---|---|---|
| Resin composition | Resin 2 | Resin 3 | Resin 7 |
| Form of resin | 50 mm$^3$ Granule | 20 mm$^3$ Granule | Liquid |
| Interval between semiconductor element and substrate ($\mu$m) | 30 | 30 | 30 |
| Size (mm□) | 30 | 30 | 30 |
| Ratio of filling defective package (defectives/samples) | 0/20 | 0/20 | 0/20 |
| Thermal shock cycle test after reflow (defectives/samples) Number of cycle | | | |
| 100 | 0/20 | 0/20 | 0/20 |
| 200 | 0/20 | 0/20 | 0/20 |
| 400 | 0/20 | 0/20 | 0/20 |
| 700 | 0/20 | 0/20 | 0/20 |
| 1000 | 0/20 | 0/20 | 0/20 |
| Pressure cooker test after reflow (defectives/samples) Time | | | |
| 100 | 0/20 | 0/20 | 0/20 |
| 200 | 0/20 | 0/20 | 0/20 |

TABLE 13-continued

| 400 | 0/20 | 0/26 | 0/20 |
|---|---|---|---|
| 700 | 0/20 | 0/20 | 0/20 |
| 1000 | 0/20 | 0/20 | 0/26 |

As shown in Table 13, even when a granular or liquid resin was employed as a sealing resin, it was possible, as in the case of the aforementioned resin sheet, to mold excellent packages which were free from voids and unfilled portion missing of sealing resin, and indicated an excellent reliability in the tests performed after the molding. In particular, in the case of the granular resin, it was possible to minimize the soil of mold due to fine resin powder, and to feed a predetermined quantity of resin by controlling the number of granule. Therefore, it was possible to conform with various sizes of the package by making use of one kind of granular resin.

Next, the packages of Examples 42 to 46 were manufactured using a frame-like mold provided with a through-hole as an air vent in accordance with the process shown in FIGS. 6A, 6B or 6C, and the properties of the resultant packages were investigated. The through-holes or air vents which were formed on the bottom of the side walls of the frame-like molds 1, 2 and 3 were about 1 mm in width and 100 $\mu$m in height. Further, the Resin 1, Resin 2 and Resin 3 were molded into a sealing resin sheet having a thickness of 1 mm. Then, the molding was performed under the normal pressure and at a temperature of 180° C. After molding, the packages were post-cured for 8 hours at a temperature of 180° C. thereby completing the packages. The thickness of the resin layer of each package was about 0.5 mm as measured from the surface of the substrate.

Subsequently, the thermal shock cycle test and the pressure cooker test were performed on each package in the same manner as mentioned above, the results being summarized together with the ratio of filling-defective package in Table 14.

TABLE 14

|  | Example 42 | Example 43 | Example 44 | Example 45 | Example 46 |
|---|---|---|---|---|---|
| Resin composition | Resin 3 | Resin 3 | Resin 1 | Resin 2 | Resin 3 |
| Molding method | FIG. 6A | FIG. 6B | FIG. 6C | FIG. 6C | FIG. 6C |
| Interval between semiconductor element and substrate ($\mu$m) | 30 | 30 | 30 | 30 | 30 |
| Size (mm□) | 30 | 30 | 30 | 30 | 30 |
| Ratio of filling defective package (defectives/samples) | 0/20 | 0/20 | 0/20 | 0/20 | 0/20 |
| Thermal shock cycle test after reflow (defectives/samples) Number of cycle | | | | | |
| 100 | 0/20 | 0/20 | 0/20 | 0/20 | 0/20 |
| 200 | 0/20 | 0/20 | 0/20 | 0/20 | 0/20 |
| 400 | 0/20 | 0/20 | 0/20 | 0/20 | 0/20 |
| 700 | 0/20 | 0/20 | 0/20 | 0/20 | 0/20 |
| 1000 | 0/20 | 0/20 | 0/20 | 0/20 | 0/20 |
| Pressure cooker test after reflow (defectives/samples) Time | | | | | |
| 100 | 0/20 | 0/20 | 0/20 | 0/20 | 0/20 |
| 200 | 0/20 | 0/20 | 0/20 | 0/20 | 0/20 |
| 400 | 0/20 | 0/20 | 0/20 | 0/20 | 0/20 |

TABLE 14-continued

|  | Example 42 | Example 43 | Example 44 | Example 45 | Example 46 |
|---|---|---|---|---|---|
| 700 | 0/20 | 0/20 | 0/20 | 0/20 | 0/20 |
| 1000 | 0/20 | 0/20 | 0/20 | 0/20 | 0/20 |

As shown in Table 14, in spite of the fact that the packaged of Examples 42 to 46 were sealed under the normal pressure, the generation of an unfilled portion missing of sealing resin was not recognized in the resin layer formed in a space between the semiconductor element and the substrate. Therefore, it was possible to mold packages which were excellent in reliability, generating no defective in the reliability tests performed after the molding. It will be seen from these results that when the molding is performed by making use of a frame-like mold provided with an air vent, while contacting the side of semiconductor element with the side wall having the air vent of the mold, a package of high reliability can be obtained even under the normal pressure.

Further, the packages of Examples 47 to 50 were manufactured in accordance with the process shown in FIGS. 8A to 8C, and the properties of the resultant packages were investigated. The substrate employed herein was provided at the center portion thereof with a through-hole or air vent having a diameter of about 0.5 mm. As for the semiconductor element, four kinds of semiconductor element each differing in size from each other, i.e. 10 mm×10 mm, 20 mm×20 mm, 30 mm×30 mm and 40 mm×40 mm were employed. The Resin 3 was molded into a sealing sheet having a thickness of 1 mm and disposed below the substrate together with the frame-like mold. Then, the molding was all performed under the normal pressure and at a temperature of 180° C. After molding, the packages were post-cured for 8 hours at a temperature of 180° C. thereby completing the packages. The thickness of the resin layer of each package was about 0.5 mm as measured from the surface of the substrate.

Subsequently, the thermal shock cycle test and the pressure cooker test were performed on each package in the same manner as mentioned above, the results being summarized together with the ratio of filling-defective package in Table 15.

TABLE 15

|  | Example 47 | Example 48 | Example 49 | Example 50 |
|---|---|---|---|---|
| Resin composition | Resin 3 | Resin 3 | Resin 3 | Resin 3 |
| Interval between semiconductor element and substrate ($\mu$m) | 30 | 30 | 30 | 30 |
| Size (mm□) | 10 | 20 | 30 | 40 |
| Ratio of filling defective package (defectives/samples) | 0/20 | 0/20 | 0/20 | 0/20 |
| Thermal shock cycle test after reflow (defectives/samples) Number of cycle |  |  |  |  |
| 100 | 0/20 | 0/20 | 0/20 | 0/20 |
| 200 | 0/20 | 0/20 | 0/20 | 0/20 |
| 400 | 0/20 | 0/20 | 0/20 | 0/20 |
| 700 | 0/20 | 0/20 | 0/20 | 0/20 |
| 1000 | 0/20 | 0/20 | 0/20 | 0/20 |

TABLE 15-continued

|  | Example 47 | Example 48 | Example 49 | Example 50 |
|---|---|---|---|---|
| Pressure cooker test after reflow (defectives/samples) Time |  |  |  |  |
| 100 | 0/20 | 0/20 | 0/20 | 0/20 |
| 200 | 0/20 | 0/20 | 0/20 | 0/20 |
| 400 | 0/20 | 0/20 | 0/20 | 0/20 |
| 700 | 0/20 | 0/20 | 0/20 | 0/20 |
| 1000 | 0/20 | 0/20 | 0/20 | 0/20 |

As shown in Table 15, in spite of the fact that the packaged of Examples 47 to 50 were sealed under the normal pressure, the generation of an unfilled portion missing of sealing resin was not recognized in the resin layer formed in a space between the semiconductor element and the substrate. Therefore, it was possible to mold packages which were excellent in reliability, generating no defective in the reliability tests performed after the molding. It will be seen from these results that when the filling of resin is performed by making use of a substrate provided with an air vent, and the sealing resin is introduced from the bottom side of the substrate, a package of high reliability can be obtained even under the normal pressure.

Further, the packages of Examples 51 and 52 were manufactured by making use of a press mold, the movable portion of which was columnar in shape as shown in FIGS. 9A and 9B. On the other hand, the package of Reference Example 30 was manufactured by making use of a press mold, the movable portion of which was angular in shape as shown in FIG. 10. The Resin 3 was molded into a sealing sheet having a thickness of 1 mm. Then, the molding was all performed under the normal pressure and at a temperature of 180° C. After molding, the packages were post-cured for 8 hours at a temperature of 180° C. thereby completing the packages. The thickness of the resin layer of each package was about 0.5 mm as measured from the surface of the substrate.

Subsequently, the longitudinal burr formed on each package was measured, and at the same time, the frequency of cleaning of mold which was required to be performed was counted, the results being summarized in Table 16.

TABLE 16

|  | Example 51 | Example 52 | Reference Example 30 |
|---|---|---|---|
| Resin composition | Resin 3 | Resin 3 | Resin 3 |
| Molding method | FIG. 9A | FIG. 9B | FIG. 10 |
| Interval between semiconductor element and substrate ($\mu$m) | 30 | 30 | 30 |
| Size (mm□) | 30 | 30 | 30 |
| Length of longitudinal burr (interval between press mold/frame mold) | 1 | 1 | 4 |
| Frequency of cleaning of mold (cleaning/molding) | 1/50 | 1/50 | 1/10 |

As shown in Table 16, the longitudinal burr formed on each package of Examples 51 and 52 was as short as 1 mm. Therefore, the cleaning of mold was required to be performed every 50 times of molding. The reason for this can be ascribed to the fact that since the movable portions between the molds were columnar in the case of the press mold shown in FIGS. 9A and 9B, and hence they could be worked in high precision, the gap between the molds was extremely narrow.

On the other hand, in the case of Reference Example 30 where an angular press mold was employed, the longitudinal burr formed on the package was as long as 4 mm, which was assumed to be caused by a wide gap formed between the molds, thus allowing a large quantity of sealing resin to be leaked therefrom. As a result, the cleaning of mold was required to be performed every 10 times of molding.

Figure 12:
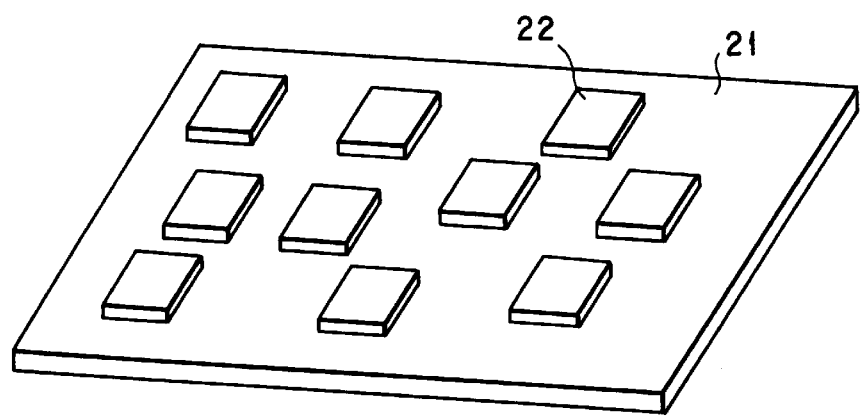
FIG. 12 is a perspective views showing a semiconductor element which is mounted on a substrate and to be sealed according to this invention.

In the foregoing examples, the package was manufactured by sealing only one semiconductor element. However, it is also possible by making use of the process of this invention shown in FIGS. 2A to 2D to seal a plurality of semiconductor elements which are disposed any irregular manner. As shown in FIG. 12, 10 pieces of semiconductor elements 22, each having a dimension of 20 mm×20 mm×0.45 mm, were irregularly mounted via bumps 30 μm in height on a wiring circuit substrate 21 having a dimension of 200 mm×250 mm×1 mm, and then these semiconductor elements 22 were encapsulated with a sealing resin by making use of a mold illustrated in FIG. 2A to 2D. The mold employed in this case was constituted by a frame-like mold and a press mold. The dimension of the press mold was set to 25 mm×25 mm, which was slightly larger than the semiconductor element 22. The dimension of the frame-like mold was selected to be 25 mm×25 mm in inner size so as to conform with the press mold and 30 mm×30 mm in outer size. Accordingly, the wall thickness of the frame-like mold was 2.5 mm. A board-like mold was disposed below the bottom surface of the wiring circuit substrate so as to withstand the pressure from the upper molds.

Figure 13:
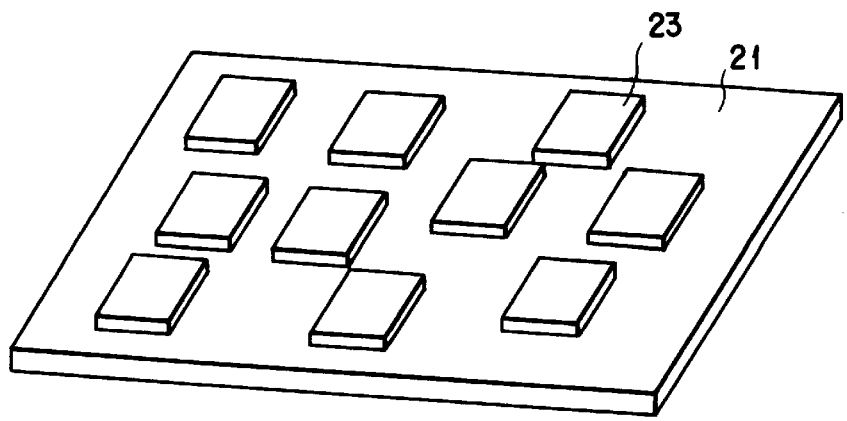
FIG. 13 is a perspective views showing a package prepared according to this invention.

A molding was performed by making use of this mold under the conditions of 180° C. in molding temperature and 60 kg/cm² in molding pressure to obtain a package 23 having a thickness of 0.8 mm as shown in FIG. 13.

Since the mold to be employed in the method of this invention is relatively small, it is possible to optionally move the mold or the substrate in conformity with the location of each of the semiconductor elements disposed irregularly on the substrate thereby to perform the sealing of each semiconductor element.

As explained above, it is possible according to this invention to provide a method of manufacturing a resin-encapsulated semiconductor device, which makes it possible to easily form a void-free resin layer all over (without leaving an unfilled portion) a semiconductor element which has been mounted facedown on a substrate. Accordingly, it is possible, by making use of the aforementioned method, to provide a resin-encapsulated semiconductor device which is capable of withstanding an external shock and of avoiding a warpage thereof, and is excellent in reliability. Therefore, this invention is very valuable in industrial view point.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a resin-encapsulated semiconductor device, which comprises the steps of:

mounting a semiconductor element facedown on a substrate provided with a wiring circuit with a main surface of said semiconductor element being faced to said substrate;

disposing a sealing resin substantially only on a bottom surface opposite to said main surface of said semiconductor element;

positioning a press mold above said semiconductor substrate bearing said semiconductor element and said sealing resin; and applying a pressure onto said sealing resin by said press mold to cause said sealing resin to flow to the sides of said semiconductor element and into a space between said semiconductor element and said substrate, thereby sealing said semiconductor element with said sealing resin.

2. The method of manufacturing a resin-encapsulated semiconductor device according to claim 1, comprising disposing said sealing resin having a size approximately the same as a size of said bottom surface of said semiconductor element.

3. The method of manufacturing a resin-encapsulated semiconductor device according to claim 1, wherein said sealing resin layer comprises epoxy resin, phenol resin, a catalyst and a filler containing a spherical filler;

the content of said filler being not less than 50% by weight based on an entire resin composition, the content of said spherical filler being not less than 50% by weight based on an entire filler; and a maximum particle diameter of said filler (R) meeting a relationship represented by the following equation (1);

$$R<0.95L \tag{1}$$

wherein L is an interval between of said substrate provided with a wiring circuit and said semiconductor element.

4. The method of manufacturing a resin-encapsulated semiconductor device according to claim 1, wherein said sealing resin disposed on a bottom surface of said semiconductor element is sheet-like, granular or liquid.

5. The method of manufacturing a resin-encapsulated semiconductor device according to claim 1, wherein a step of sealing said semiconductor element with said sealing resin is performed while keeping a vacuum of a cavity of the mold.

6. The method of manufacturing a resin-encapsulated semiconductor device according to claim 1, wherein said substrate bearing a wiring circuit is provided with a through-hole, whereby allowing a residual air and/or an excessive portion of sealing resin in a space between said semiconductor element and said substrate to be discharged through said through-hole at an occasion of filling said space with said sealing resin.

7. A method of manufacturing a resin-encapsulated semiconductor device, which comprises the steps of:

mounting a semiconductor element facedown on a substrate provided with a wiring circuit with a main surface of said semiconductor element being faced to and substantially covered by said substrate to form a space between said semiconductor element and said substrate;

positioning a frame-like mold around said semiconductor element mounted on said substrate;

positioning a press mold which is designed to fit in said frame-like mold and adapted to move up and down within said frame-like mold; and applying a pressure, by means of said press mold, onto a sealing resin which has been placed in advance on a bottom surface of said semiconductor element within said frame-like mold and said press mold, thereby forcing said sealing resin to flow to the sides of said semiconductor element and into said space between said semiconductor element and said substrate, thereby sealing said semiconductor element with said sealing resin.

8. The method of manufacturing a resin-encapsulated semiconductor device according to claim 7, wherein said sealing resin layer comprises epoxy resin, phenol resin, a catalyst and a filler containing a spherical filler;

the content of said filler being not less than 50% by weight based on an entire resin composition, the content of said spherical filler being not less than 50% by weight based on an entire filler; and a maximum particle diameter of said filler (R) meeting a relationship represented by the following equation (1);

$$R < 0.95L \qquad (1)$$

wherein L is an interval between of said substrate provided with a wiring circuit and said semiconductor element.

9. A method of manufacturing a resin-encapsulated semiconductor device, which comprises the steps of:

mounting a semiconductor element facedown on a substrate provided with a wiring circuit with a main surface of said semiconductor element being faced to said substrate;

positioning a frame-like mold around said semiconductor element mounted on said substrate;

positioning a press mold which is designed to fit in said frame-like mold and adapted to move up and down within said frame-like mold; and applying a pressure, by means of said press mold, onto a sealing resin which has been placed in advance in a region defined by said frame-like mold and said press mold, thereby forcing said sealing resin to flow into a space between said semiconductor element and said substrate, to the sides of said semiconductor element and on the bottom surface of said semiconductor element, thereby sealing said semiconductor element with said sealing resin;

wherein one to three side walls among all of the side walls of said frame-like mold is respectively provided with a through-hole, and said semiconductor element is disposed in said frame-like mold in such a manner that at least one side of said semiconductor element is contacted with at least one of said one to three of said side walls provided with a through-hole.

10. The method of manufacturing a resin-encapsulated semiconductor device according to claim 8, wherein a movable portion of said frame-like mold and a movable portion of said press mold are respectively columnar in shape.

11. The method of manufacturing a resin-encapsulated semiconductor device according to claim 10, wherein a step of sealing said semiconductor element with said sealing resin is performed while keeping a vacuum of a cavity of the mold.

12. The method of manufacturing a resin-encapsulated semiconductor device according to claim 7, wherein said sealing resin disposed on a bottom surface of said semiconductor element is sheet-like, granular or liquid.

13. The method of manufacturing a resin-encapsulated semiconductor device according to claim 7, wherein a step of sealing said semiconductor element with said sealing resin is performed while keeping a vacuum of a cavity of the mold.

14. The method of manufacturing a resin-encapsulated semiconductor device according to claim 7, wherein said substrate bearing a wiring circuit is provided with a through-hole, whereby allowing a residual air and/or an excessive portion of sealing resin in a space between said semiconductor element and said substrate to be discharged through said through-hole at an occasion of filling said space with said sealing resin.

15. The method of manufacturing a resin-encapsulated semiconductor device according to claim 7, comprising disposing said sealing resin having a size approximately the same as a size of said bottom surface of said semiconductor element.

* * * * *